(12) United States Patent
Buck et al.

(10) Patent No.: US 10,113,728 B2
(45) Date of Patent: Oct. 30, 2018

(54) JUNCTION BOX FOR MULTIPLE LED DRIVERS

(71) Applicant: Elemental LED, Inc., Reno, NV (US)

(72) Inventors: Wesley Buck, Albany, CA (US); Russell Petersen, Alameda, CA (US)

(73) Assignee: Elemental LED, Inc., Reno, NV (US)

(*) Notice: Subject to any disclaimer, the term of this patent is extended or adjusted under 35 U.S.C. 154(b) by 0 days.

(21) Appl. No.: 15/923,941

(22) Filed: Mar. 16, 2018

(65) Prior Publication Data

US 2018/0209624 A1    Jul. 26, 2018

Related U.S. Application Data

(63) Continuation of application No. 15/454,476, filed on Mar. 9, 2017, now Pat. No. 9,951,934.

(Continued)

(51) Int. Cl.
| | |
|---|---|
| *F21V 23/00* | (2015.01) |
| *F21V 29/83* | (2015.01) |
| *F21V 31/00* | (2006.01) |
| *F21V 17/12* | (2006.01) |
| *H02G 15/10* | (2006.01) |
| *H05K 5/03* | (2006.01) |
| *H05K 5/00* | (2006.01) |
| *F21Y 115/10* | (2016.01) |
| *F21W 131/10* | (2006.01) |

(52) U.S. Cl.
CPC ............ *F21V 23/003* (2013.01); *F21V 17/12* (2013.01); *F21V 23/001* (2013.01); *F21V 29/83* (2015.01); *F21V 31/005* (2013.01); *H02G 15/10* (2013.01); *H05K 5/0091* (2013.01); *H05K 5/03* (2013.01); *F21W 2131/10* (2013.01); *F21Y 2115/10* (2016.08)

(58) Field of Classification Search
CPC .... F21V 23/003; F21V 23/001; F21V 31/005; F21Y 2115/10; H05K 5/0091; H05K 5/03; H02G 15/10
See application file for complete search history.

(56) References Cited

U.S. PATENT DOCUMENTS

| | | |
|---|---|---|
| 5,472,355 A | 12/1995 | Nittmann |
| 5,594,207 A | 1/1997 | Fabian et al. |

(Continued)

FOREIGN PATENT DOCUMENTS

| | | |
|---|---|---|
| DE | 19501339 C1 | 8/1996 |
| WO | WO1998023015 A1 | 5/1998 |

OTHER PUBLICATIONS

Elemental LED, Inc. "Switchex." 2016 Diode LED catalog, pp. 1 and 85, Jan. 2016.

(Continued)

*Primary Examiner* — Stephen Castellano
(74) *Attorney, Agent, or Firm* — Andrew McAleavey

(57) ABSTRACT

Junction boxes for enclosing and making electrical connections to multiple LED drivers are disclosed. The junction boxes include a bottom or base and a cover. Dividers arising from the base divide the junction box into high-voltage and low-voltage compartments. A cut-out open at the top of each divider allows drivers to be placed in a junction box without having to pull wires through holes or openings. Typically, the base is open along two sidewalls, with the cover being U-shaped to complete the enclosure. Various mounting mechanisms are disclosed for securing drivers within junction boxes.

20 Claims, 19 Drawing Sheets

Related U.S. Application Data

(60) Provisional application No. 62/436,318, filed on Dec. 19, 2016, provisional application No. 62/309,744, filed on Mar. 17, 2016.

(56) References Cited

U.S. PATENT DOCUMENTS

| | | |
|---|---|---|
| 5,962,811 A | 10/1999 | Rodrigues et al. |
| 6,091,023 A | 7/2000 | O'Donnell |
| 2003/0056964 A1 | 3/2003 | Lalancette et al. |
| 2003/0102143 A1 | 6/2003 | Sato et al. |
| 2006/0191697 A1 | 8/2006 | Cardenas et al. |
| 2008/0105461 A1 | 5/2008 | King et al. |
| 2009/0065247 A1 | 3/2009 | Shelton et al. |
| 2013/0258682 A1 | 10/2013 | Pino et al. |

OTHER PUBLICATIONS

International Search Report for PCT/US2017/022129, filed Mar. 13, 2017. Report dated Jun. 19, 2017.

JUNCTION BOX FOR MULTIPLE LED DRIVERS

CROSS-REFERENCE TO RELATED APPLICATIONS

This application is a continuation of U.S. patent application Ser. No. 15/454,476, filed Mar. 9, 2017, now U.S. Pat. No. 9,951,934, which claims priority to U.S. Provisional Patent Application No. 62/309,744, filed Mar. 17, 2016, and to U.S. Provisional Patent Application No. 62/436,318, filed Dec. 19, 2016. The contents of all of those applications are incorporated by reference herein in their entirety.

BACKGROUND OF THE INVENTION

1. Field of the Invention

The invention relates to junction boxes for making electrical connections, and more particularly, to junction boxes adapted for use with multiple drivers.

2. Description of Related Art

Lighting based on light-emitting diodes (LEDs) has become increasingly popular because of its high efficiency, relatively low cost, and adaptability. However, as LED-based lighting has come into wider usage, a number of challenges have arisen. Chief among those challenges is the fact that most LED lighting does not operate on typical household or commercial alternating current (AC) power. Many LED lighting systems operate at a lower voltage, and most use direct current (DC) power, rather than AC power.

In order to supply power of the necessary type at the necessary voltage, LED lighting systems usually include one or more drivers between the power source and the actual LEDs. The driver, typically a transformer/rectifier, converts the incoming power to the type and voltage of power needed to power (i.e., drive) the LEDs. As one example, LED lighting may operate at 5V, 12V, or 24V DC, whereas household or commercial current is typically 110V, 220-240V, or 277V. Drivers come in a wide variety of sizes, depending on the input voltage, the output voltage, and the amount of power that the driver is to supply.

For reasons of electrical safety and convenience, connections to a driver, and from the driver to an LED or cable, are made within a junction box, typically a metal enclosure. Junction boxes are subject to various safety regulations, typically including the physical separation of the high voltage and low voltage sides of the circuit. Since junction boxes are often installed in tight spaces, their installation is not necessarily easy, and the need to painstakingly pull wires through the physical barriers between high- and low-voltage sides of a junction box can make the task much more difficult.

Additionally, each junction box is typically designed to work with a single type of driver—or, at most, a limited number of drivers of similar sizes and characteristics. However, as drivers may vary considerably in size and other characteristics, this means that a working electrician may need a variety of junction boxes of different sizes and characteristics in order to handle any particular job.

SUMMARY OF THE INVENTION

Aspects of the invention relate to junction boxes that are adapted to accept drivers of various sizes and that can be readily configured and used. A junction box according to one embodiment of the invention has a bottom or base. Dividers arising from the base divide the junction box into three compartments: a main compartment, into which a driver may be installed, and two end compartments. A U-shaped cut-out in each of the dividers allows an installer to "drop in" a driver without having to pull its wires through holes, and each of the compartments includes a number of frangible portions that may be punched out to make holes for wires to enter the junction box. Those frangible portions may be provided at the ends and along the sides of the two compartments, which allows the installer to select exactly where he or she wishes the wires to enter the junction box. Hardware mounted to the base is adapted to secure the driver within the junction box, and in many cases, allows an installer to do so without tools. A cover covers and closes the junction box and supplies a top and at least a part of a sidewall of the junction box, leaving the base open along at least one sidewall for ease of driver installation. The cover may, for example, be L-shaped or U-shaped. If the cover is U-shaped, it may define parts of two sidewalls, leaving the base open from two sides during driver installation.

In junction boxes according to this embodiment of the invention, the compartments serve as separated areas in which to make high-voltage and low-voltage connections, respectively, and the presence of the dividers is intended to comply with typical electrical safety regulations regarding separation of high-voltage and low-voltage electrical components and connections. In many embodiments, the junction boxes are arranged symmetrically, i.e., with identical compartments, such that either compartment may act as the high-voltage compartment or the low-voltage compartment, and an installer thus does not need to consider the orientation of the junction box when installing the driver.

Another aspect of the invention relates to junction boxes that can accept more than one driver. Junction boxes according to this aspect of the invention typically include a bottom or base and a cover. The base has a central compartment and sets of compartments provided at each end of the base. Dividers between the central compartment of the base and the end compartments have U-shaped cut-outs, again allowing a driver to be "dropped in" without having to pull wires through holes. Multiple drivers can be placed on the base and secured to it side-by-side, with their respective wires extending into individual end compartments. The compartments have frangible portions that may be punched-out to create holes for the passage of wires. The drivers may be secured individually to the base, or by a single common bracket. Various embodiments of covers typically provide a top and at least some portion of at least one sidewall of the junction box, leaving the base open and accessible along at least one sidewall during driver installation. Additionally, in at least some embodiments, the covers may have structure that extends around or between the drivers in order to secure them. In some embodiments, the junction box may define only a single compartment at each end—one compartment for all of the high-voltage wiring and one compartment for all of the low-voltage wiring. Junction boxes according to these aspects of the invention are typically symmetrical, such that either compartment or set of compartments may act as the high-voltage compartment and either may act as the low-voltage compartment. The compartments are provided with frangible portions, as in junction boxes according to other aspects of the invention.

Yet another aspect of the invention relates to weather-resistant or weather-proof junction boxes. The junction boxes include a bottom or base and a cover. Dividers arising from the base divide the junction box into three compartments: a main compartment, into which a driver may be installed, and two end compartments. A U-shaped cut-out in each of the dividers allows an installer to "drop in" a driver without having to pull its wires through holes, and each of the compartments includes a number of frangible portions that may be punched out to make holes for wires to enter the junction box. Those frangible portions may be provided at the ends and along the sides of the two compartments, which allows the installer to select exactly where he or she wishes the wires to enter the junction box. Hardware mounted to the base is adapted to secure the driver within the junction box, and in many cases, allows an installer to do so without tools. As in other embodiments, the cover generally covers and defines the top and at least a portion of one of the sidewalls of the junction box. The cover also includes depending flaps that extend down over the joint between cover and base. Junction boxes according to these embodiments of the invention typically do not include regular sets of holes or openings for ventilation, but they may include drainage holes or other such openings, so that any water that enters the junction box can readily exit. Other embodiments of weather-resistant junction boxes according to aspects of the invention may use sealing structure, such as a gasket or gaskets, between the base and the cover.

A further aspect of the present invention relates to junction boxes with reduced internal structure. Junction boxes according to this aspect of the invention typically include a bottom or base and a cover. The base is divided into a main compartment, which would typically carry a driver and its low-voltage wiring, and a high-voltage compartment. The high-voltage compartment is separated from the main compartment by a divider that has a U-shaped cut-out, so that a driver can be "dropped in" without having to pull wires through holes. The cover typically defines the top and at least a portion of at least one sidewall of the junction box, which means that the base is open at the top and along at least a portion of one sidewall during driver installation. In some embodiments, the dividers may be removable.

Additional further aspects of the invention relate to mechanisms for securing drivers within junction boxes, including, for example, by a bracket permanently connected to the junction box, by straps, or by clips.

Other aspects, features, and advantages of the invention will be set forth in the description that follows.

BRIEF DESCRIPTION OF THE DRAWING FIGURES

The invention will be described with respect to the following drawing figures, in which like numerals represent like elements throughout the views, and in which:

FIGS. 20-23 are perspective views of an end compartment of a junction box, illustrating various arrangements for removable dividers;

DETAILED DESCRIPTION

Figure 1:
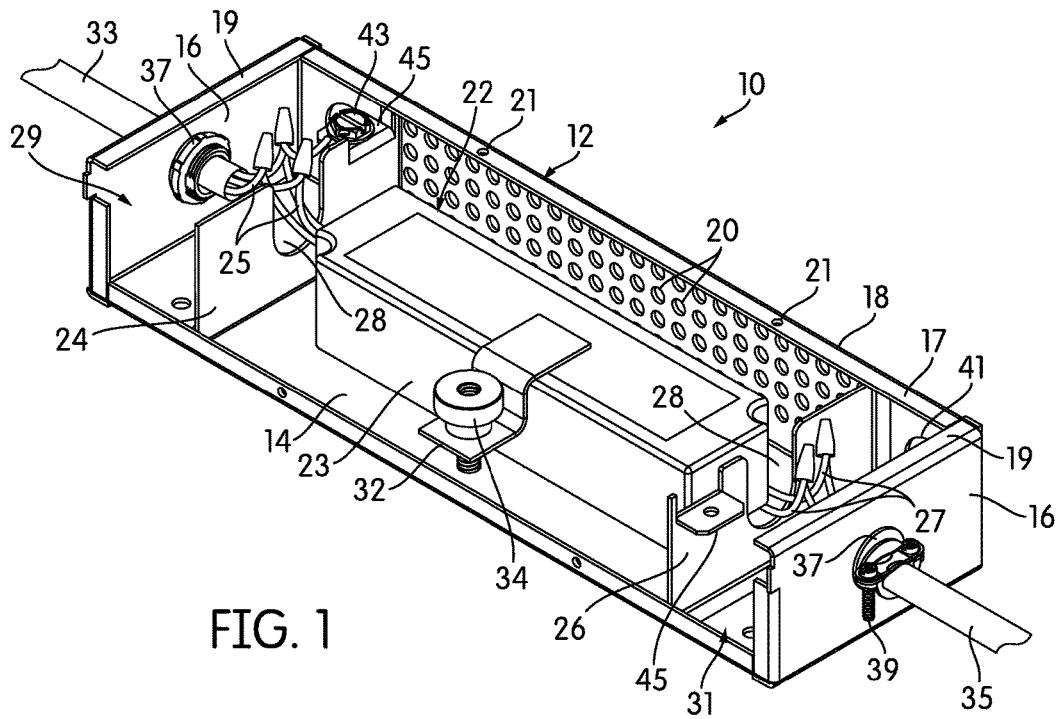
FIG. 1 is a perspective view of a junction box according to one embodiment of the invention, shown with its cover removed.

FIG. 1 is a perspective view of a junction box, generally indicated at 10, according to one embodiment of the invention. The junction box 10 is typically a metal enclosure with a cover. In the illustrated embodiment, a first part 12 of the junction box 10 defines a bottom or base 14. Arising from the base 14 are two end faces 16 and a long, side face 18. The side face 18 of the illustrated embodiment has perforations 20 for ventilation. The first part 12 of the junction box 10 thus provides four faces of what, when assembled, is a six-face rectangular prism. An L-shaped cover (not shown in FIG. 1) provides the remaining faces and closes the junction box 10. Each of the upstanding faces 16, 18 includes bent-over tabs or flanges 17, 19 that include holes 21 for attaching to the cover with fasteners. Of course, other configurations are possible and the cover may be, for example, U-shaped.

The junction box 10 includes a driver compartment 22 that has ample space to allow the placement of any number of different types of drivers. A driver 23 is shown in FIG. 1, secured within the compartment 22 in a manner that will be described below in more detail. The driver 23 has the general shape of a rectangular prism, although other drivers may have other shapes. As is typical, the driver 23 has a high-voltage side with high-voltage input wires 25 on one side, and a low-voltage side with low-voltage output wires 27 on the other side. In the illustrated embodiment, the high-voltage wires 25 protrude on one end face of the driver 23 and the low-voltage wires 27 protrude from the other end face of the driver 23.

On either end of the driver compartment 22, dividers 24, 26 arise from the base 14 to separate high and low voltage areas of the junction box 10. Thus, in the illustrated embodiment, the central driver compartment 22 is adapted to contain the driver, while smaller compartments 29, 31 to each side of the driver compartment 22 are provided to separate low voltage from high voltage and to allow wires to pass into and out of the junction box 10. As can be seen in FIG. 1, the high-voltage wires 25 from the driver 23 extend and make connections within the high-voltage compartment 29, and the low-voltage wires 27 extend and make connections within the low-voltage compartment 31.

While the precise nature of the wires and connections may vary from embodiment to embodiment, in a typical installation, the high-voltage wires 25 from the driver would connect with power and ground leads from, for example, type NM non-metallic building wire (e.g., ROMEX® cable) 33, or other suitable high-voltage wiring, while the low-voltage wires 27 would connect to appropriate low-voltage leads 35. The low-voltage leads 35 would typically be wires of appropriate gauge and insulation. As is well known in the art, the requirements for low-voltage wiring are generally less stringent than the requirements for high-voltage wiring. While the exact definitions of "low voltage" and "high voltage" differ depending on the authority one consults, voltages under 50V are typically considered to be low voltage, and the term "low voltage" in this specification should be construed to refer to voltages under about 50V.

Whereas prior art dividers might have a hole in order to allow wires to pass, the two dividers 24, 26 have U-shaped cut-outs 28 that are open at the top and terminate in a rounded edge two-thirds to three-quarters of the way down the panel 24, 26. (The shape of the bottoms of the cut-outs 28 is not critical, and may be different in other embodiments.) The cut-outs 28 allow a user to "drop in" a driver 23 and seat the wires 25, 27 that go with it without having to pull the wires 25, 27 through a hole.

Of course, both end faces 16 of the junction box 10 have openings 30 to allow wires to exit the box 10. A two-part threaded collar 37 fits within the openings 30, and along the exterior, a connected clamp 39 fixes the position of the incoming and outgoing wiring 33, 35. The clamps 39 are typical hardware in junction box-type connections, and provide both fixation and a measure of strain relief to the incoming and outgoing wires or cable. Of course, type NM cable is only one type of element that may be used with the junction box 10. In other embodiments, any type of element may be connected to the openings 30, including metallic and non-metallic conduit.

Typically, as constructed, the junction box 10 will have a number of "potential" openings—circles or squares of material 41, for example, connected to the body of the junction box 10 by frangible score or break lines—either continuous or perforated. The installer can punch out the circles of material 41 as needed to create the openings 30 necessary for any particular job, leaving the others in place so that the junction box 10 remains closed and sealed along walls where openings are not necessary. In essence, the circles or squares of frangible material 41 arrayed around the faces of the junction box 10 are potential openings for wires. The junction box 10 may, for example, have one of these potential openings 41 on each end along each of the side faces and in the cover, as will be described below in more detail.

As can be appreciated from the above description and from FIG. 1, one advantage of the illustrated embodiment is symmetry—while the junction box 10 has a central compartment 22 and a compartment 29, 31 at each end, it does not matter which end is which. It does not matter which compartment 29, 31 serves as the high-voltage compartment and which one serves as the low-voltage compartment. Both compartments 29, 31 have dividers 24, 26. Both dividers 24, 26 also include a grounding screw 43 for connecting the junction box 10 to ground on a flange 45 that extends horizontally outward from each divider 24, 26. These flanges 45 are arranged so that they are on opposite sides, width-wise, of their respective dividers 24, 26. Again, all of the elements in the illustrated embodiment are arranged such that an installer can take an empty junction box 10, punch out openings 30 for the necessary wires by removing frangible circles of material 41, and then drop in a driver 23 without having to worry about which side is which. As shown in FIG. 1, the grounding wire from the high-voltage wires 25 is connected to the grounding flange 45 by the grounding screw 43.

Figure 2:
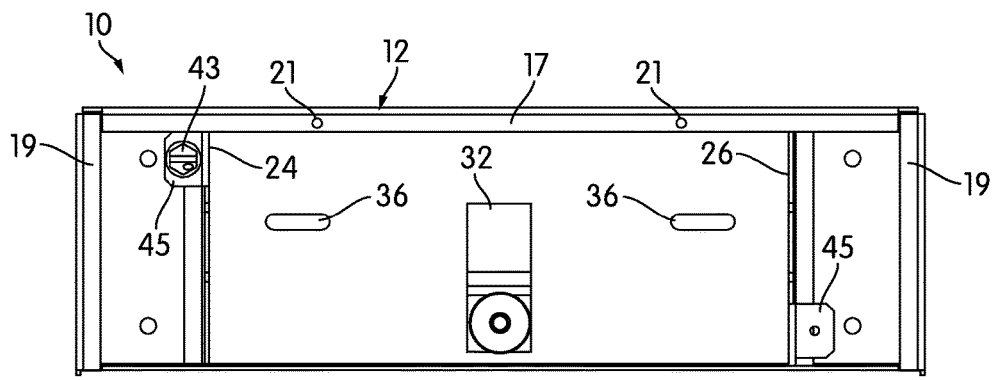
FIG. 2 is a top plan view of the junction box of FIG. 1, shown with no driver installed and no cover.
Figure 3:
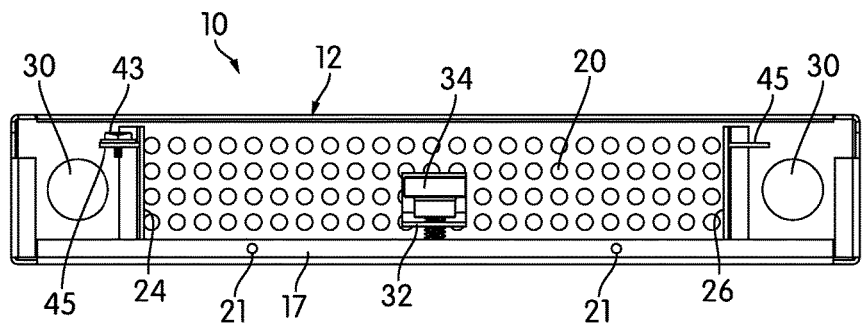
FIG. 3 is a side elevational view of the junction box of FIG. 1, shown with cover removed.

FIG. 2 is a top plan view of the junction box 10 with the driver 23 removed, and FIG. 3 is a side elevational view of the junction box 10, also with the driver 23 removed. As shown in FIGS. 2 and 3, one or more Z-brackets 32 are secured to the base 14, in this case by a thumbscrew 34. The thumbscrew 34 allows the Z-bracket 32 some range of vertical translation, so as to accommodate drivers of different heights. In some cases, the thumbscrew 34 may be surrounded by a concentrically mounted coil spring, allowing the thumbscrew 34 to apply tension regardless of its height. Depending on the size and weight of the driver, there may be a single Z-bracket 32, two brackets 32, or several brackets 32 positioned on each side of the driver. The brackets 32 may have a thin layer of foam or rubber to increase friction and traction.

Of course, the nature of the fasteners and other elements that secure the driver within the junction box 10 is not critical, and other types of fasteners and other elements may be used. In addition to metal and other types of rigid brackets, in other embodiments, a buckle-and-strap arrangement, or straps with hook-and-loop fastener, may be used. It is advantageous if the fasteners can be quickly applied to secure a driver, preferably without tools, and allow some degree of dimensional variation between different kinds of drivers. For example, wing nuts on threaded rods or screws may be used in other embodiments to secure brackets that are attached to the junction box 10 on both sides of the driver 23. Other mechanisms for fastening drivers will be described below.

As shown particularly in FIG. 2, the base 14 of the junction box 10 includes a number of openings or slots 36. There may be several rows of openings or slots 36, spaced at defined intervals from one another. These openings or slots 36 would generally be used to receive and secure hardware to hold the driver 23 within the junction box 10, although some of the openings or slots 38 may also be used to secure the junction box 10 itself to an external surface. In some cases, particularly if the base 14 of the junction box 10 is thick enough, openings 36 may be threaded.

Figure 4:
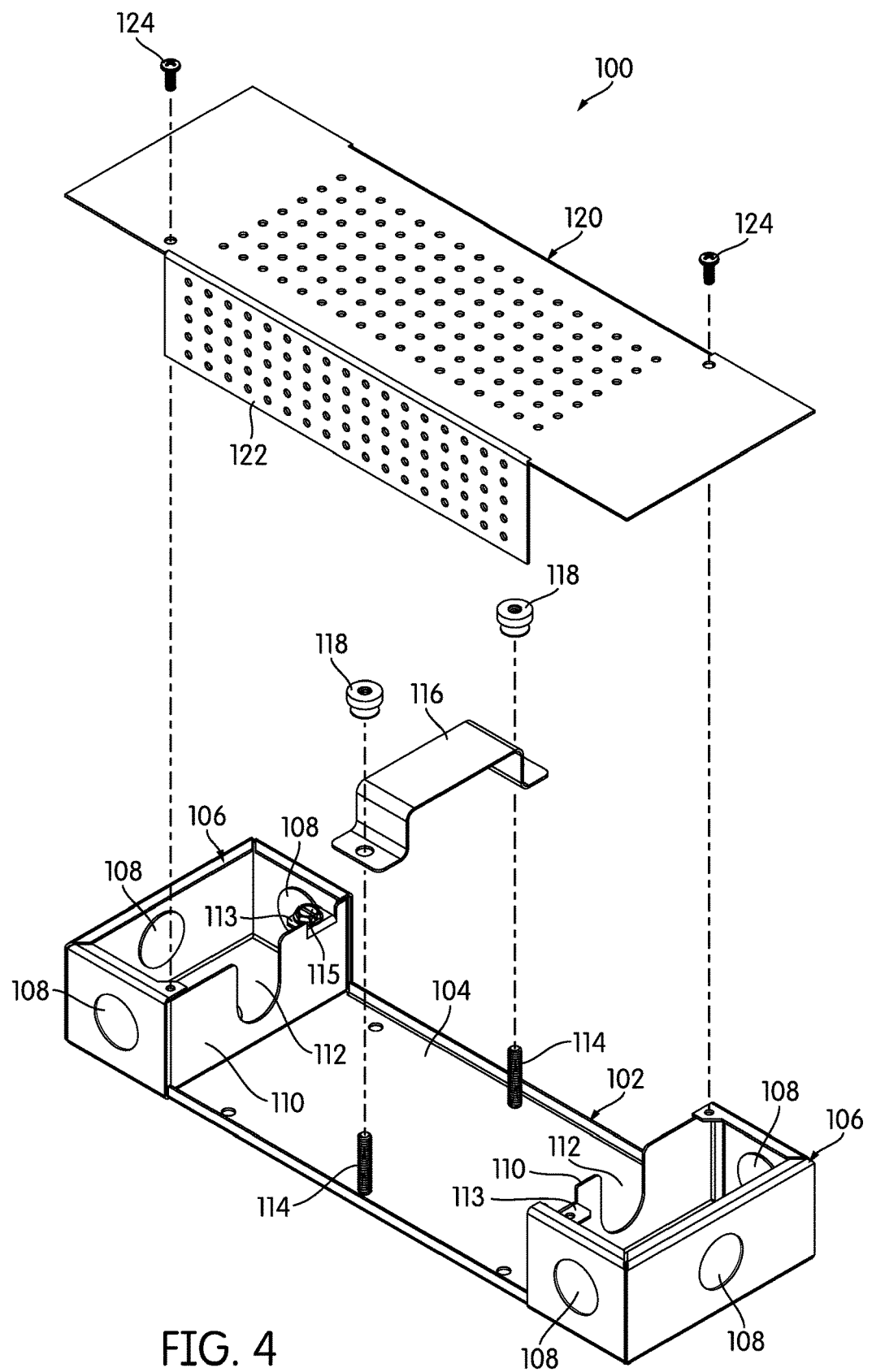
FIG. 4 is an exploded perspective view of a junction box according to another embodiment of the invention, shown with no driver.
Figure 5:
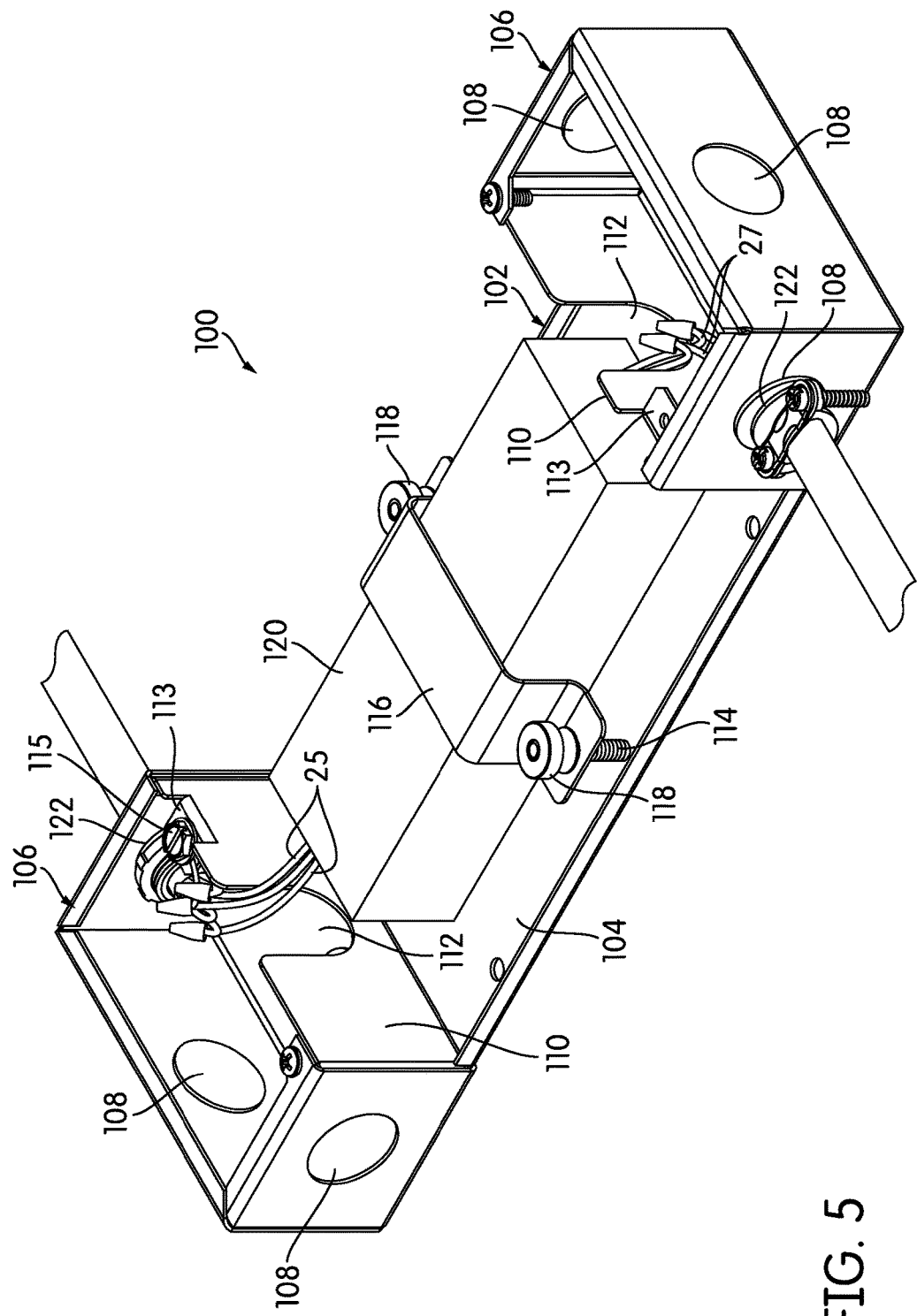
FIG. 5 is a perspective view of the junction box of FIG. 4 with its cover removed, showing a driver installed.

FIG. 4 is an exploded perspective view of a junction box, generally indicated at 100, according to another embodiment of the invention. In FIG. 4, a driver is not shown. FIG. 5 is a perspective view of the assembled, open junction box 100. As compared with the junction box 10 described above, the junction box 100 serves the same functions but has a slightly different interior arrangement.

More specifically, the base 102 of the junction box 100 has a bottom 104. At each end, a four-walled compartment 106 arises from the bottom 104. Each side of the compartment 106 has a frangible portion 108 that can be punched out by the installer to create an opening for wires. Like in the junction box 10, the interior-facing wall 110 of each compartment 106 is a divider that includes a U-shaped cut out 112 that allows a driver to be dropped in without having to pull wires into either of the two compartments 106. Each divider 110 includes a perpendicular flange 113 with a screw 115 for grounding the junction box 100. Overall, the two compartments 106 are symmetrical such that, as with the junction box 10 of FIGS. 1-3, an installer can place a driver in the junction box 100 without having to worry about which side is which; either side can serve as a high-voltage compartment or a low-voltage compartment.

This arrangement leaves a central portion of the bottom 104 clear for installation of a driver. In the embodiment of FIGS. 4 and 5, a pair of threaded rods 114 are installed on the bottom 104 extending vertically upward, one on each side. A U-bracket 116 is placed overtop of the threaded rods 114 and the driver and secured with thumbscrews 118, although, as noted above, wing nuts or other, similar structures may be used. The U-bracket 116 may be provided with a thin layer of foam or rubber on its underside to increase traction.

The junction box 100 also has a U-shaped cover 120, shown in the exploded view of FIG. 4, that installs over the base 102 and is secured with appropriate fasteners 124. The cover 120 of the illustrated embodiment has side panels 122 that do not extend the full length of the junction box 100, and cover only that portion of the sides that the compartments 106 do not. Whereas most electrical junction boxes are five-sided boxes with a simple lid, junction boxes according to embodiments of the present invention are designed to be much more open, among other things, to provide more space for the installer's hands. The junction box 10 of FIGS. 1-3 has an L-shaped cover that covers its top and at least a portion of one side face. The cover 120, being U-shaped, provides access through the top and portions of two sidewalls. As shown, three sides of the cover 120 are perforated for ventilation and heat dissipation, although perforations need not be included in all embodiments.

Figure 6:
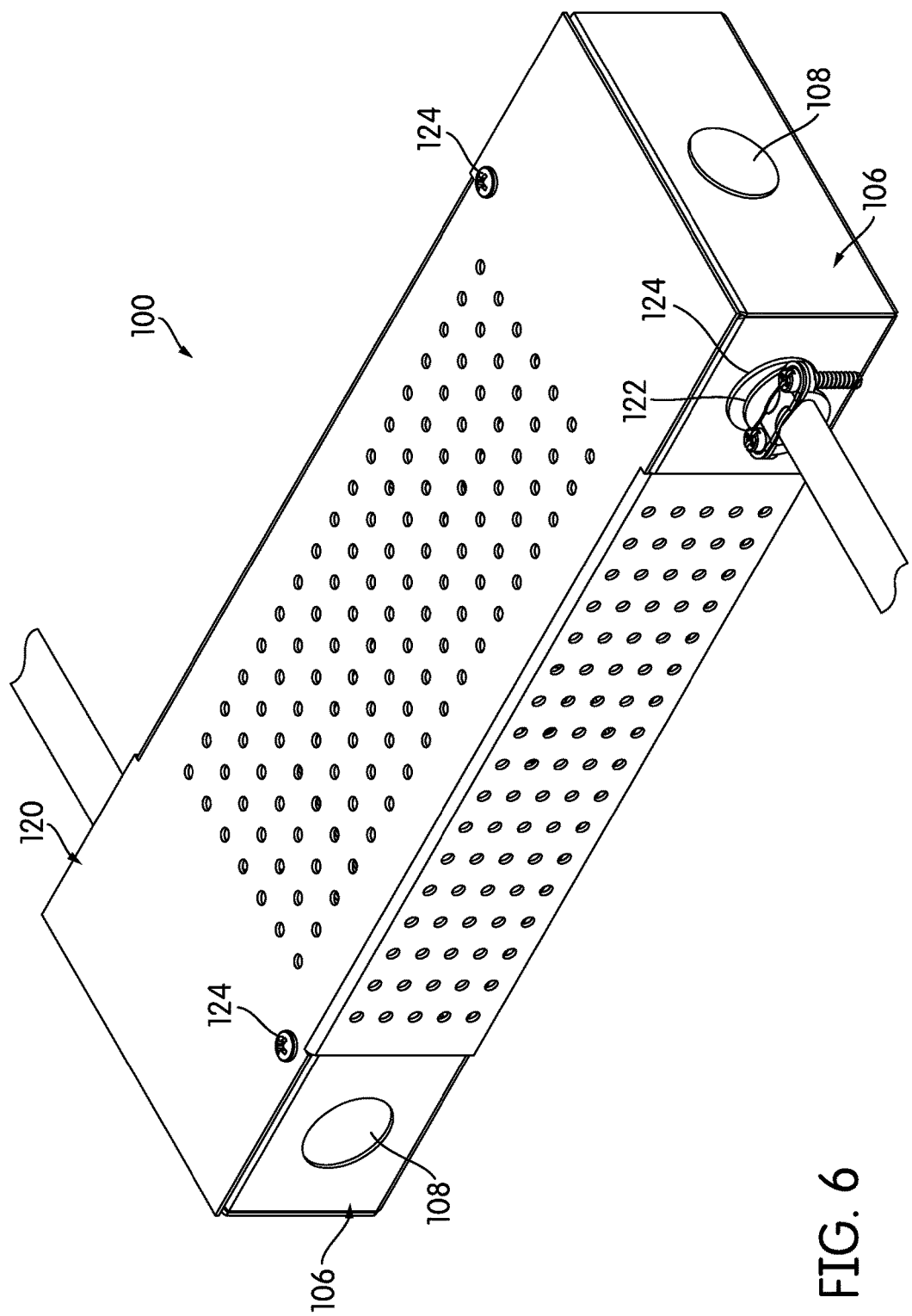
FIG. 6 is a perspective view of the junction box of FIG. 4 fully assembled.

In the perspective view of FIG. 5, a driver 120 has been installed, with the U-bracket 116 securing it in place. As can be seen in FIG. 5, instead of allowing the wires to exit the driver from the two end faces, the installer has punched out frangible portions 108 in two opposite side faces, creating a pair of openings 122 in opposite corners of the junction box 100. Each opening 122 has a collar 124 around its circumference and a clamp 39 securing the wires. The remaining frangible portions 108 remain in place. FIG. 6 is a perspective view of the junction box 100 with the cover 120 installed.

Figure 7:
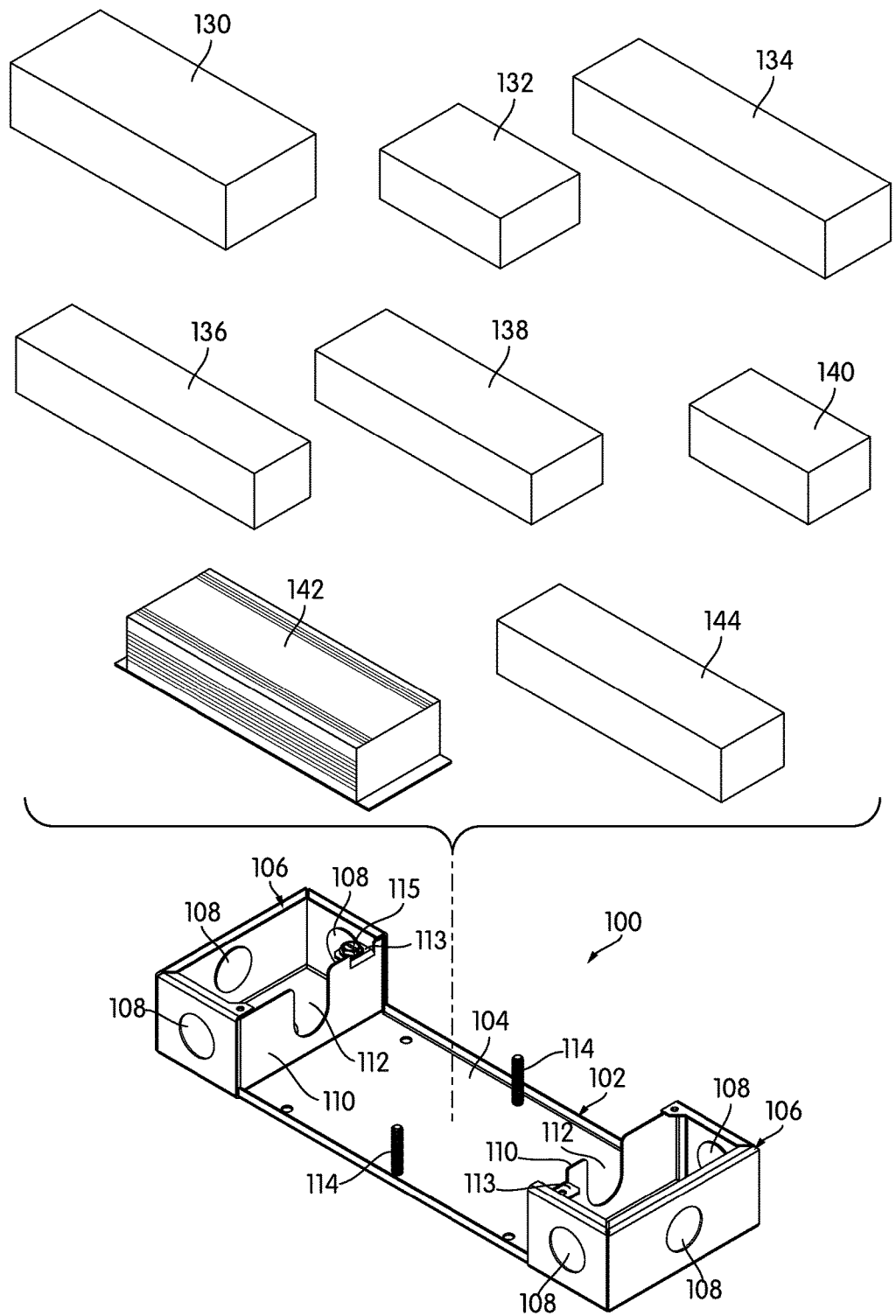
FIG. 7 is an exploded perspective view illustrating a range of drivers, illustrated schematically, that may be installed in the junction box of FIG. 6.

As the above description bears out, a single junction box can accommodate a variety of different sizes and types of drivers. FIG. 7 is an exploded perspective view illustrating the range of types of drivers 130-144 that might be placed in a single junction box 100. The drivers 130-144 are shown schematically without high- and low-voltage wiring.

Figure 8:
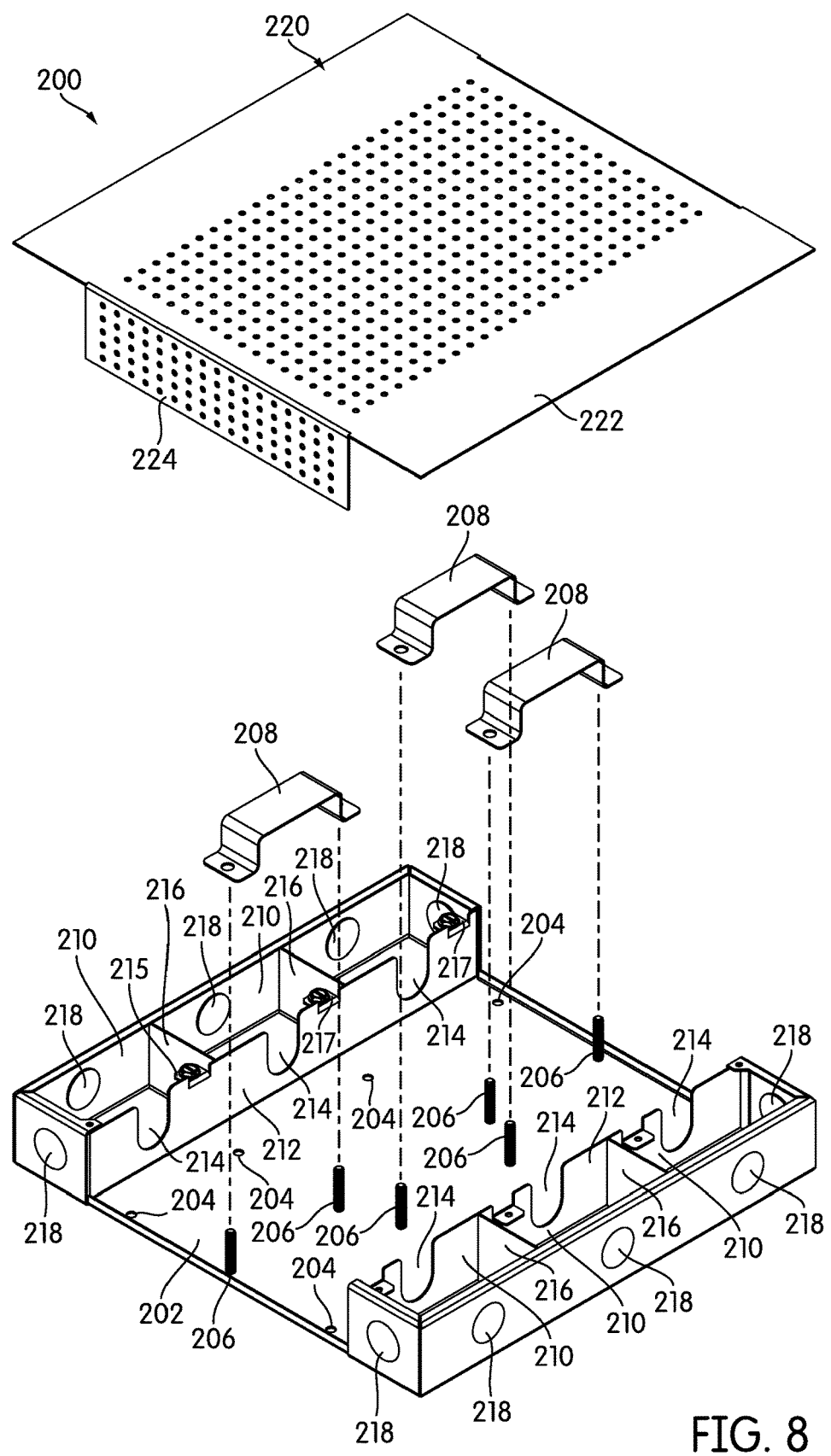
FIG. 8 is an exploded perspective view of a junction box adapted to hold several drivers according to another embodiment of the invention.

In the above description, the general assumption is that each junction box 10, 100 contains a single driver. However, that need not be the case in all embodiments. A single junction box could have enough internal space to mount several drivers. FIG. 8 is an exploded perspective view of a junction box 200 according to another embodiment of the invention.

The junction box 200 of FIG. 8 has generally the same configuration as the junction box 100 of FIG. 7. However, the junction box 200 is broadened to accommodate as many as three drivers (not shown in the view of FIG. 8). More specifically, the junction box 200 has a base 202. The base 202 has several spaced rows of openings 204 sized to accept either fasteners, or hardware for fasteners, in order to secure drivers. In the illustration of FIG. 8, sets of threaded rods 206 are seated in the openings 204 such that sets of U-brackets 208 can fit over and be secured by the rods 206.

At each end of the junction box 200, three adjacent compartments 210 are provided. Thus, in this arrangement, each driver has its own compartments 210 for high and low voltage. A pair of long divider panels 212 divide the end compartments 210 from the main compartment and base 202 of the junction box 200. Each of the divider panels 212 has a set of three U-shaped cut-outs 214, evenly spaced from one another. A perpendicular pair of shorter dividers 216 divide the compartments 210 from one another. Each compartment 210 has its own flange 217 for a grounding screw 218, which means that each of the longer divider panels 212 has three flanges 217.

A number of frangible circular discs 218 are provided at intervals along the ends and sides of the junction box 200, again allowing an installer to punch out appropriate holes for the passage of wires. The junction box 200 has a U-shaped cover 220 with a top 222 and two partial side panels 224, each of which is perforated for ventilation and heat dissipation. In other embodiments, the junction box 200 may have an L-shaped cover, like the junction box 10 of FIGS. 1-3.

Figure 9:
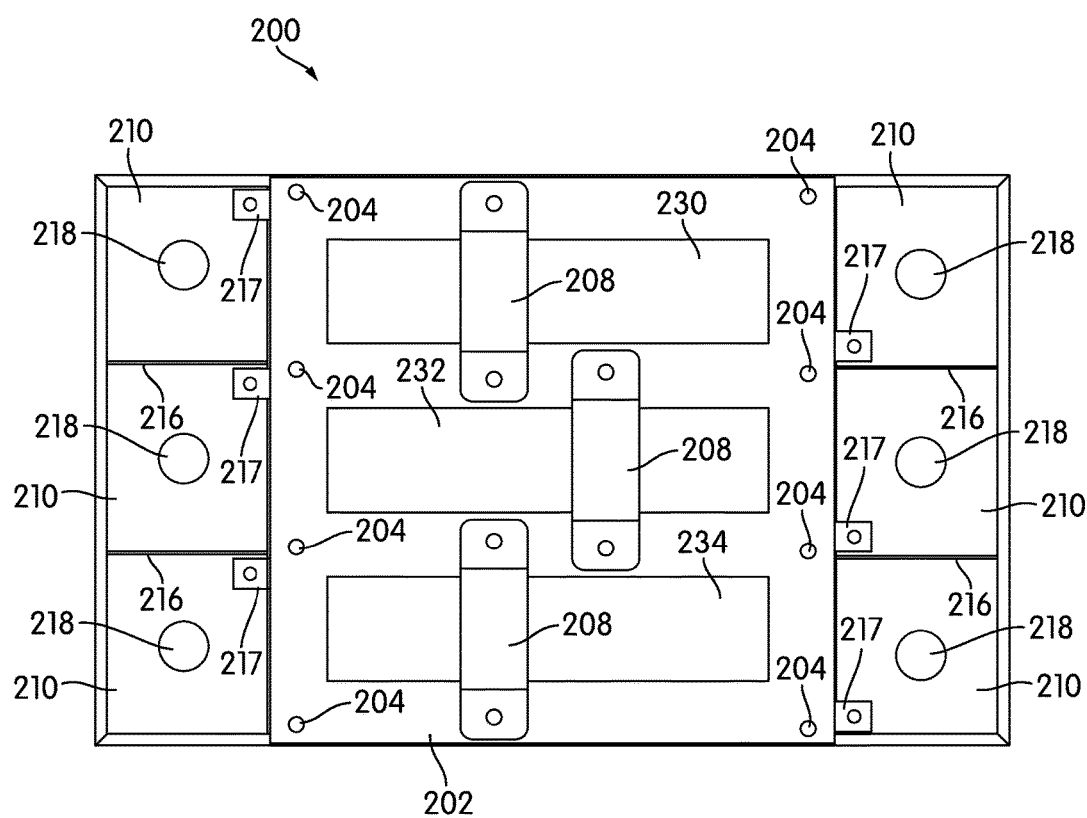
FIG. 9 is a top plan view of the junction box of FIG. 8, shown without its cover and with drivers installed.

FIG. 9 is a top plan view of the junction box 200 uncovered and with three drivers 230, 232, 234 installed. Once again, the drivers 230, 232, 234 are shown schematically, without high- or low-voltage wires, in order to illustrate features of the junction box 200. As shown in FIG. 9, when multiple drivers 230, 232, 234 are installed in the junction box 200, the brackets 208 or other hardware that secures them may be staggered in position, so as to take up less space. Of course, the drivers 230, 232, 234 may be of different types and sizes, and if they are, each driver 230, 232, 234 may be secured by hardware of different types and sizes.

Figure 10:
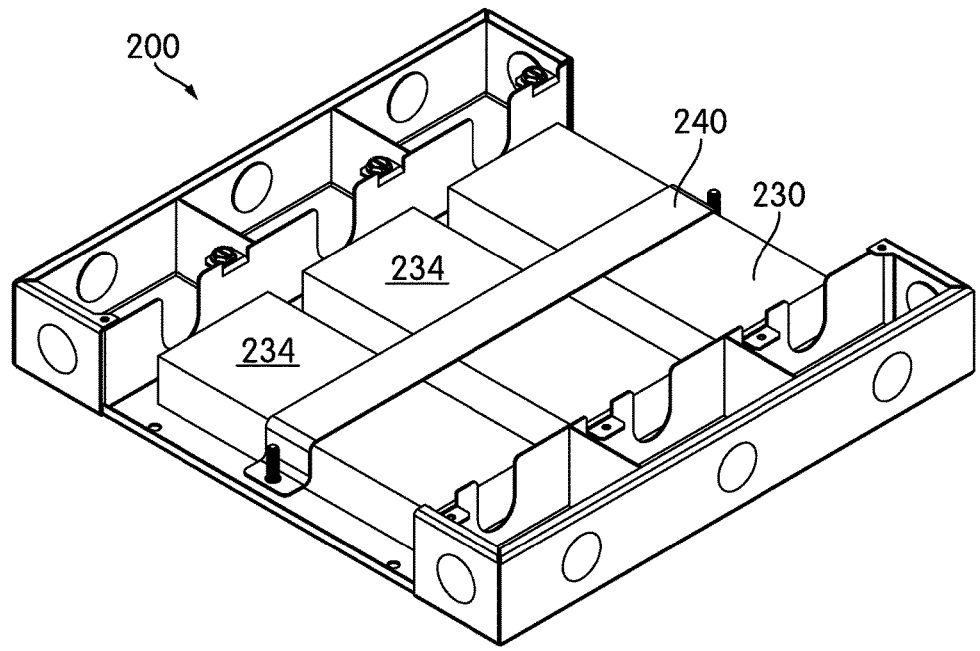
FIGS. 10-12 are perspective views illustrating various types of brackets used to secure drivers in the junction box of FIG. 8.
Figure 11:
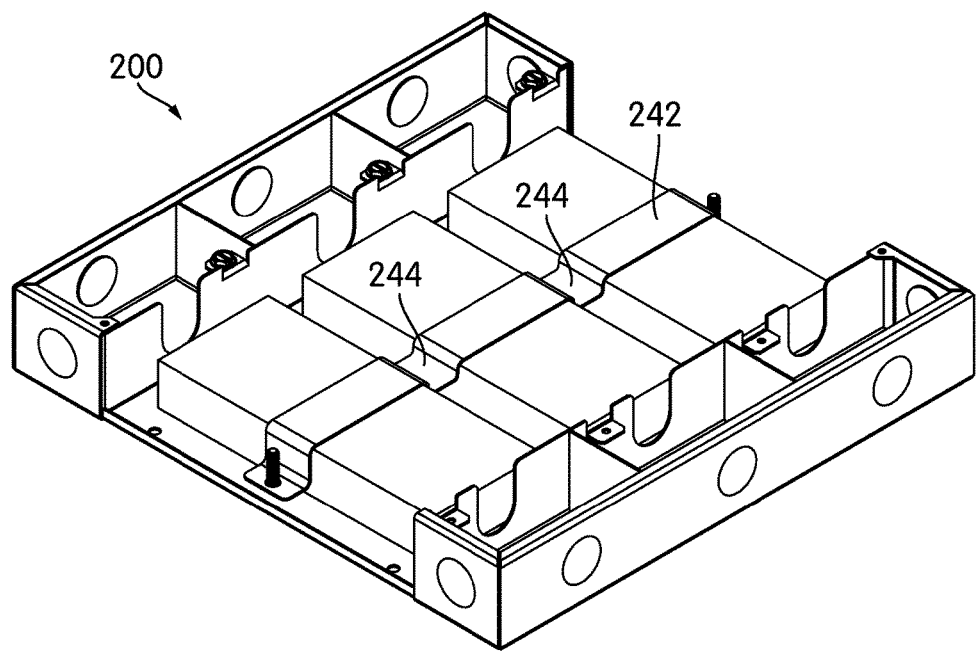
Figure 12:
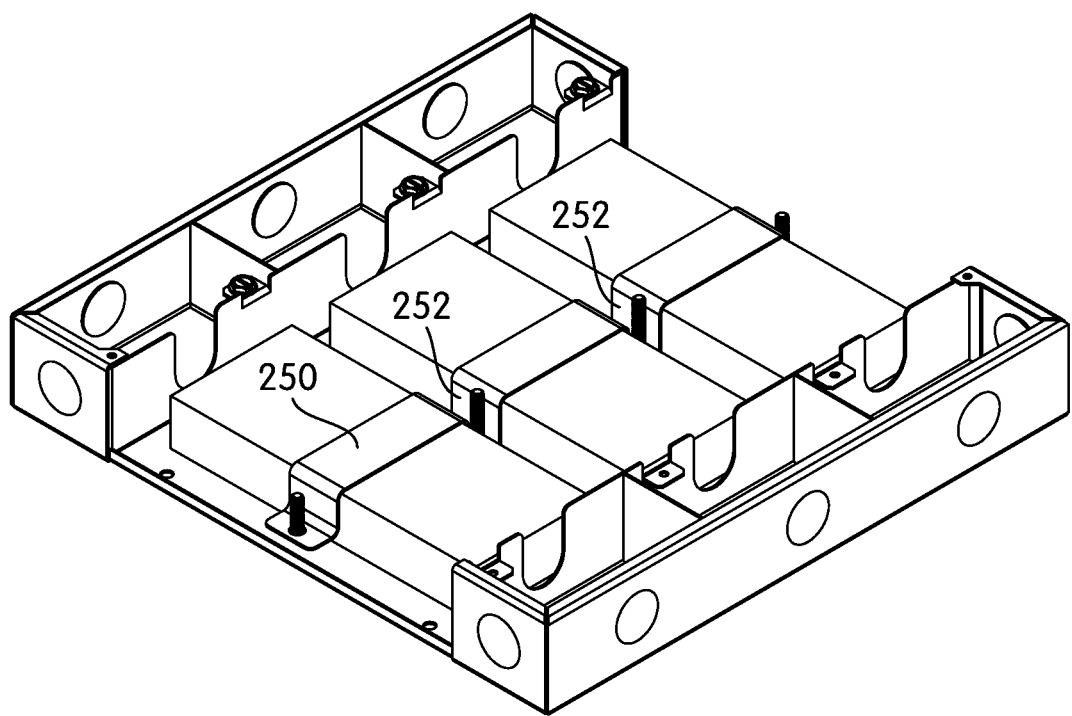

FIGS. 10 and 11 show two variations on hardware for securing multiple drivers. Although one advantage of junction boxes 10, 100, 200 according to embodiments of the invention is that they can accommodate drivers of different sizes and characteristics, when all of the drivers 230, 232, 234 are the same size and shape, a single piece of hardware can be used to secure them. In the illustration of FIG. 10, a single, elongated U-bracket 240 secures all three drivers 230, 232, 234. In the illustration of FIG. 11, a single bracket 242 again secures all three drivers 230, 232, 234. The bracket 242 has depressions 244 between the drivers 230, 232, 234 to maintain their lateral positions. In the perspective view of FIG. 12, a bracket 250 includes depressions 252 that extend all the way to the base 202 of the junction box 200. The bracket 250 is secured to the base 202 independently at each depression 252 by, for example, a thumbscrew, wing nut, or other such hardware.

Figure 13:
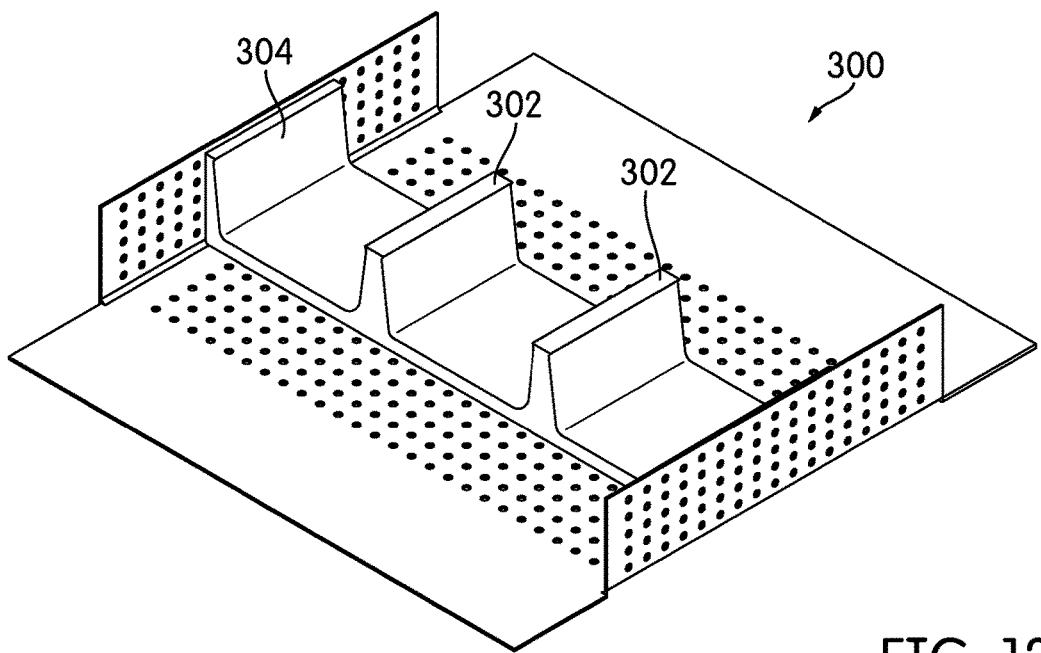
FIGS. 13 and 14 are perspective views illustrating various types of covers with structure for securing drivers that may be used with the junction box of FIG. 8.

In some embodiments, the cover of the junction box 200 may be provided with structure to separate and retain the drivers 230, 232, 234 in place. FIG. 13 is a perspective view of a cover 300 according to another embodiment, shown underside-up. The cover 300 has a series of depending wedges 302, 304 on its underside that, when the cover 300 is in place, are wedged between the drivers 230, 232, 234 to keep them in their respective lateral positions. If the wedges 302, 304 are dimensioned appropriately and there is enough friction between them and the drivers 230, 232, 234, it may not be necessary to use a bracket 240, 244, 250 to secure the drivers 230, 232, 234. If a single bracket 240 with no depressions is used, the wedges 302, 304 on the cover may be positioned to extend between the drivers 230, 232, 234 where the bracket 240 is not.

Figure 14:
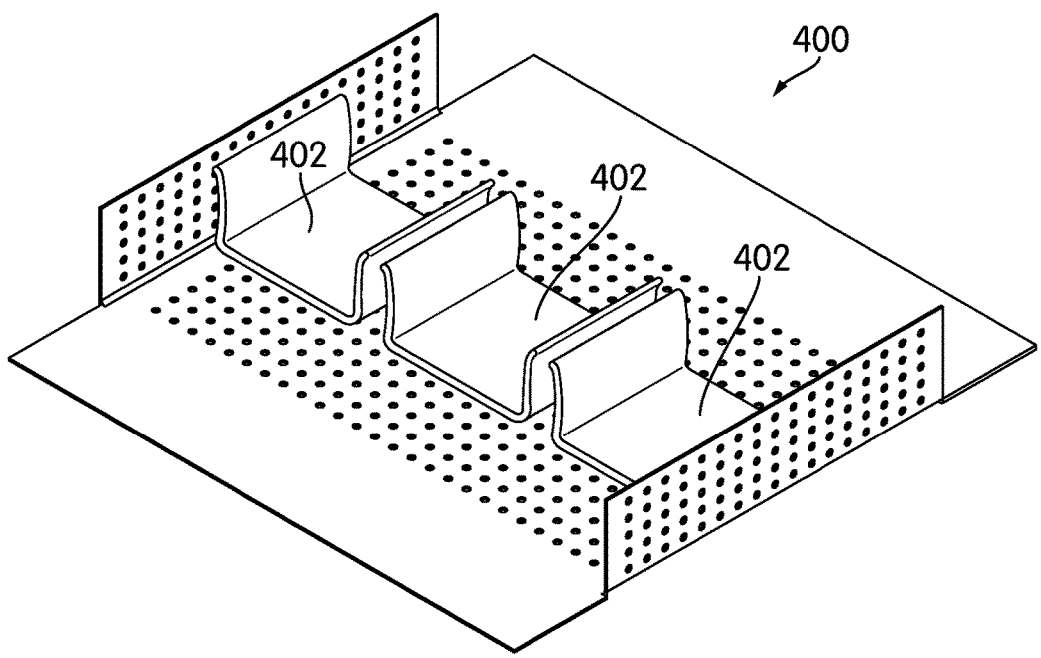

FIG. 14 is a perspective view of a cover, generally indicated at 400, according to yet another embodiment of the invention, shown underside-up. The cover 400 has a set of three spring-clips 402 fixedly attached to its underside. The three clips 402 are sized and adapted to deflect slightly outwardly as the cover 400 is pushed down over the drivers 230, 232, 234, thus retaining the drivers 230, 232, 234 in place. The clips 402 are long enough to cover a substantial portion of the drivers 230, 232, 234—like the wedges 302, 304, they extend over perhaps 25% of the length of the cover 400. The wedges 302, 304 and spring-clips 402 illustrated in FIGS. 13 and 14 may be used in single-driver junction boxes as well as in multi-driver junction boxes.

Figure 15:
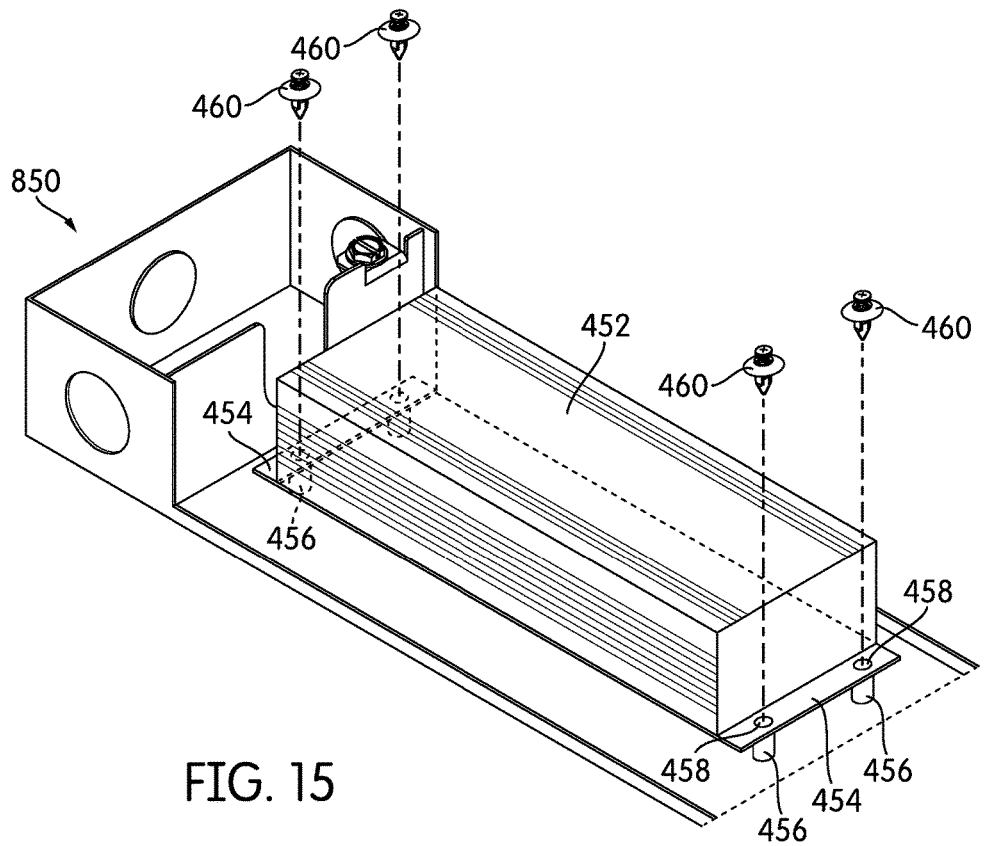
FIG. 15 is a perspective view of a portion of the bottom of a junction box, illustrating alternative hardware that may be used to secure a driver.

In addition to wedges 302, 304 and spring-clips 402, other types of fastening structures may be used to secure drivers in junction boxes according to embodiments of the present invention. For example, FIG. 15 is a perspective view of a junction box 450 according to yet another embodiment of the invention. The junction box 450 shown in FIG. 15 has a driver 452 installed, and the driver 452 itself has horizontal flanges 454 at its ends. The flanges 454 rest on short, hollow stand-off posts 456 that, in turn, rest on or are secured to the floor of the junction box 450. Each flange 454 has openings 458. Pairs of so-called "Christmas tree" plastic clips 460 insert into the openings 458 and the stand-off posts 456 in order to secure the driver 452 to the junction box 450.

"Christmas tree" clips 460 have a shank with unidirectional ribs or fins. When a clip 460 is pushed in, the ribs or fins deflect to fit within the opening 458. Once inserted, the ribs or fins release and act to resist removal of the clip 460. Some clips of this type are reusable and, e.g., feature a screw that can be driven into the clip to widen the shank of the clip, and removed to narrow the shank and allow removal of the clip. While the clips 460 are shown in one specific application in FIG. 15, securing the driver 452 to the junction box 450, clips 460 of this type may be used as replacements for other types of fasteners shown in the figures.

Figure 16:
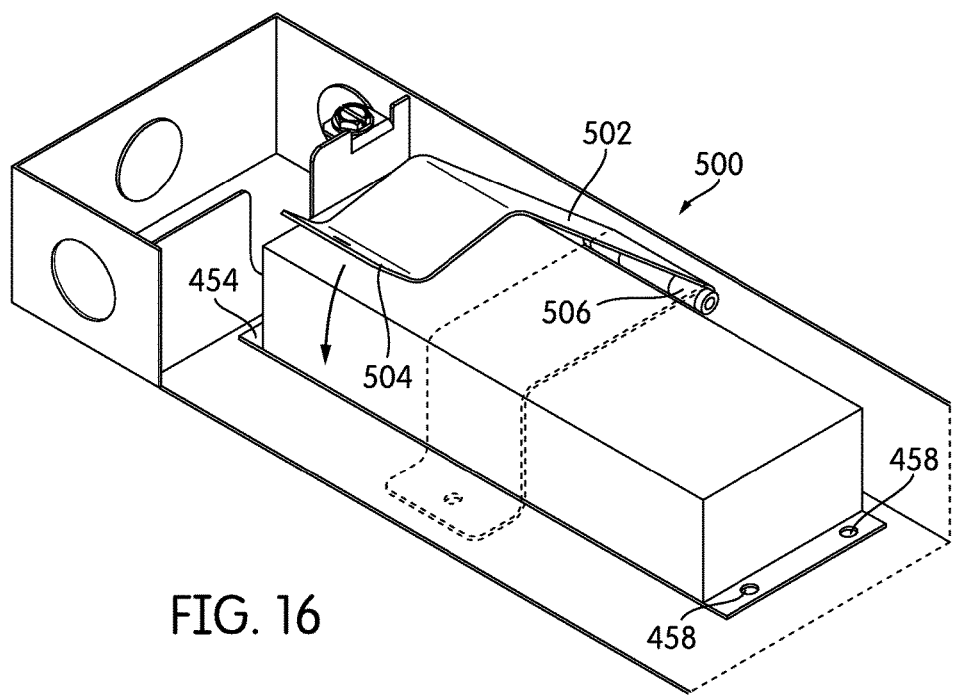
FIG. 16 is a perspective view of a portion of the bottom of a junction box, illustrating another embodiment of hardware that may be used to secure a driver.

Other types of securing structures may also be used. Since junction boxes are installed in tight spaces, where there is often little room for maneuver, ease of driver installation is a concern. As was described above, some embodiments of junction boxes according to aspects of the present invention provide additional open area and accessibility for installing drivers. It can also be helpful to reduce the number of hands or the number of steps needed to secure a driver within a junction box. For example, FIG. 16 is a perspective view of a junction box, generally indicated at 500. Instead of using threaded rods, posts, and thumbscrews or wing nuts, as do some embodiments, the junction box 500 has preinstalled installation fastening hardware, in the form of a bracket 502 that is permanently and hingedly attached to the junction box 500. More specifically, one side of the bracket 502 is fairly standard—a band of metal or plastic that extends outward and turns approximately 90° downward before turning again approximately 90° to terminate in a connecting flange 504. However, a hinge 506 permanently connects the bracket 502 with a sidewall of the junction box 500.

Depending on the particular arrangement, the hinge 506 may be connected to a sidewall of the junction box 500, if the junction box 500 has at least one sidewall, or it may be connected to the floor or bottom of the junction box 500. As shown in FIG. 16, once the driver 508 is seated in the junction box 500, the bracket 502 swings down over it and can be secured to the junction box 500 with any kind of conventional fastener, ranging from threaded rods and thumbscrews to the kind of spring clip 460 shown and described above. (Particular connecting hardware is not shown in FIG. 16.) Thus, at the least, the bracket 502 would save the installer the trouble of securing two separate sets of fasteners, one on each side of the driver 508. This type of arrangement may be particularly useful when the size of the driver 508 is known or falls within an expected range.

Figure 17:
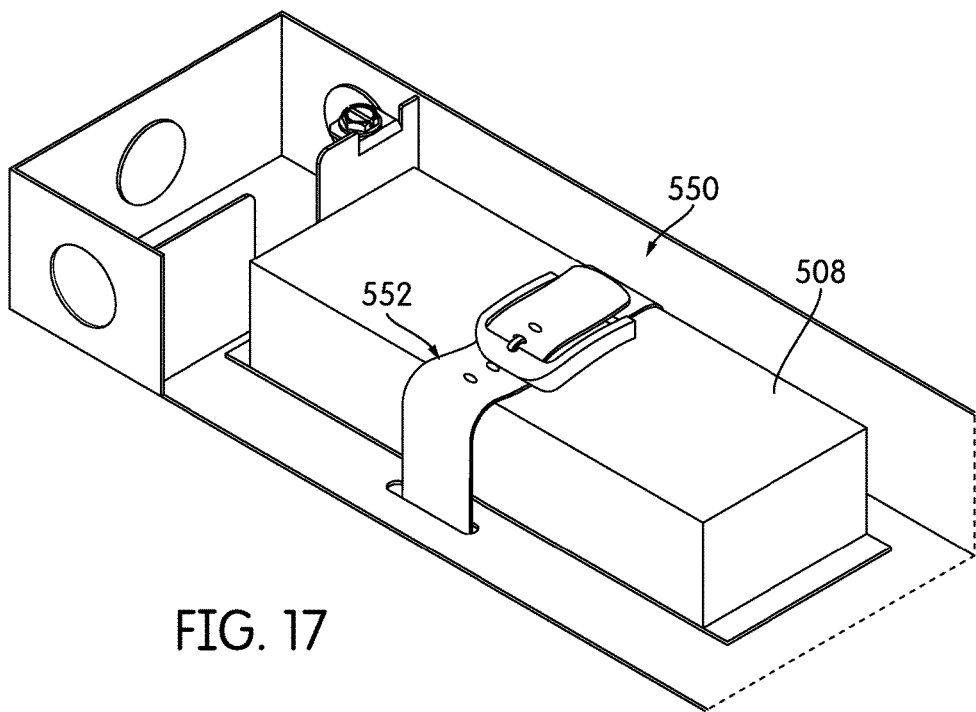
FIG. 17 is a perspective view of a portion of the bottom of a junction box, illustrating the use of a buckle-and-strap arrangement to secure a driver.

Other arrangements are possible. For example, FIG. 17 shows a junction box 550 that provides a traditional strap-and-buckle arrangement 552 to strap down a driver 508. Both ends of the arrangement 552 are fixedly attached to the floor of the junction box 550. Of course, in some embodiments, straps with hook-and-loop fastener may be used, either with one strap carrying hooks and the other strap loops, or in an arrangement where one strap carries both hook and loop portions is passed through a link and doubled back over itself. Compared with a traditional strap-and-buckle arrangement 552, straps with hook-and-loop fastener may provide a greater degree of adjustability to accommodate drivers 508 of various sizes.

Figure 18:
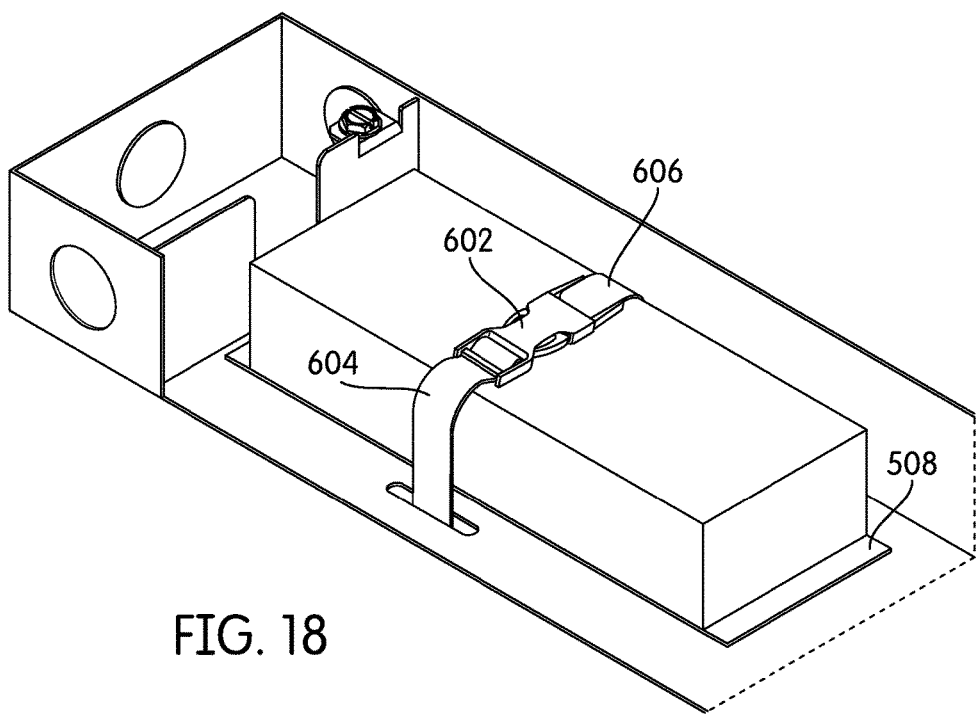
FIG. 18 is a perspective view of a portion of the bottom of a junction box, illustrating the use of quick-release straps to secure a driver.

FIG. 18, a perspective view of a junction box 600 illustrates a variant on this with a quick-connect fitting 602 connecting two straps 604, 606 in lieu of a buckle. These types of securement arrangements can accommodate a range of driver sizes and are easy for an installer to use.

Figure 19:
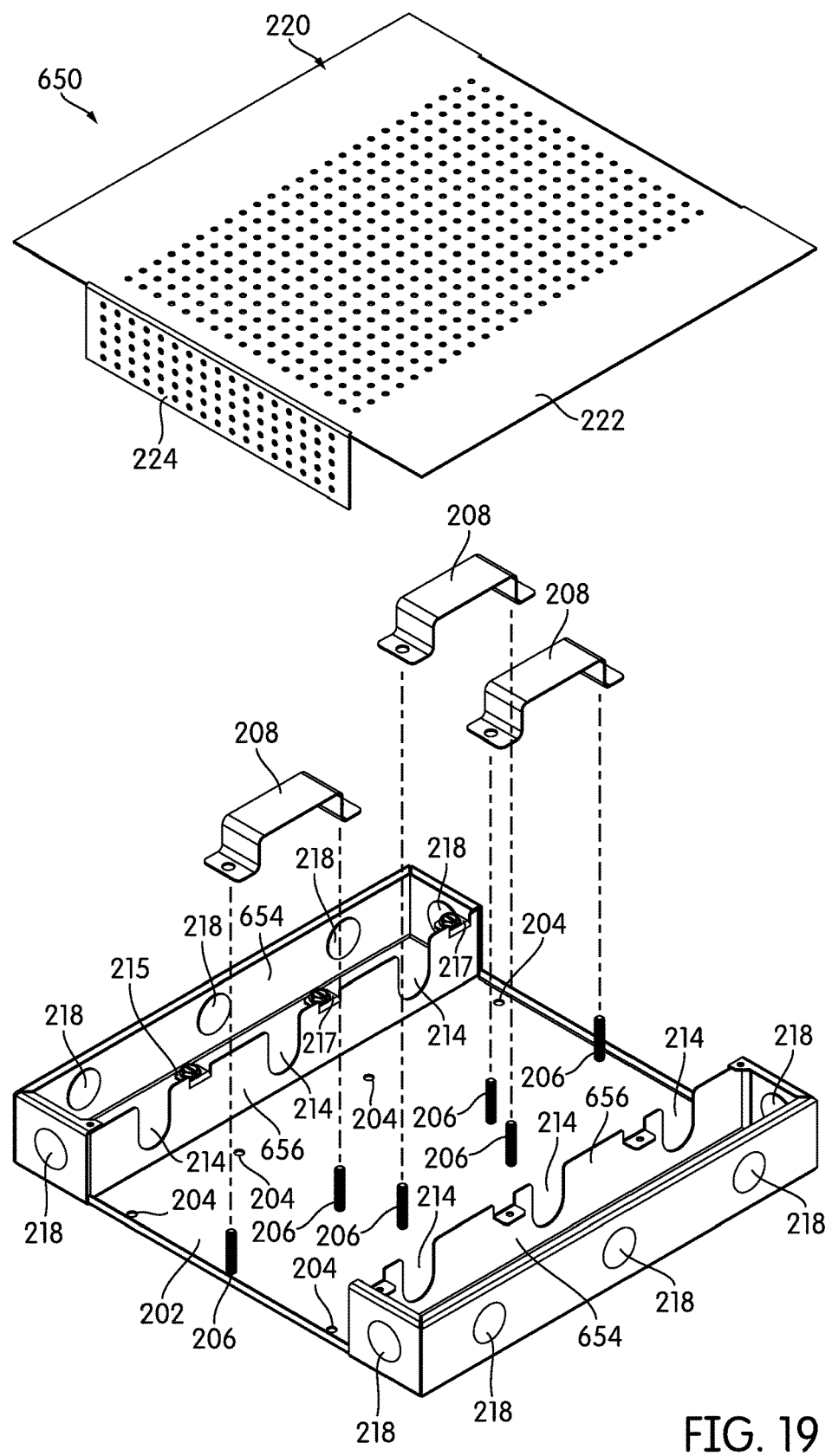
FIG. 19 is a perspective view of the bottom of a junction box, similar to the junction boxes of FIGS. 10-12, illustrating an alternative configuration for high-voltage and low-voltage compartments.

The methods of partitioning the high-voltage and low-voltage areas of the junction boxes 10, 100, 200 may also vary somewhat from embodiment to embodiment. For example, in junction box 200, a separate high- and low-voltage compartments are provided for each of the drivers 230, 232, 234. However, in some cases, it may be sufficient to provide one large high-voltage compartment for all drivers in a junction box and one large low-voltage compartment for all drivers in a junction box. FIG. 19 is a perspective view of the bottom part of a junction box, generally indicated at 650, that illustrates this concept. More specifically, the junction box 650 is wide enough to accommodate multiple drivers, and includes fittings to secure multiple drivers. However, the partitions 216 of the junction box 200 are not present in the junction box 650 of FIG. 19. Instead, there is a compartment 654 at each end of the junction box 650, and that compartment spans the width of the junction box 650. A single divider 656 spans the width of the junction box 650 on each side to separate the compartments 654 from the main portion 202 of the junction box 650. However, each divider 656 has three cut-outs 214, one for each driver that may be installed in the junction box 650.

Figure 20:
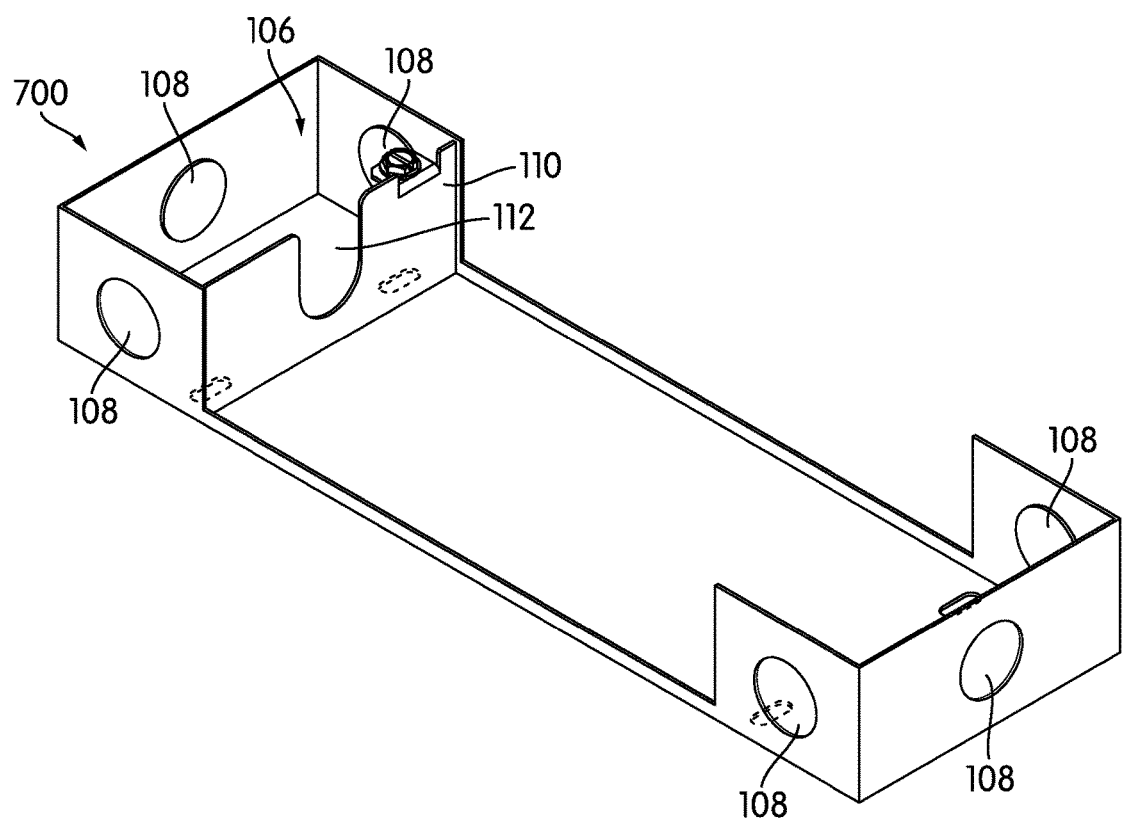
FIG. 20 is a perspective view of the bottom of a junction box with only one separated compartment for high-voltage wiring.

Additionally, while separating high-voltage wiring is good practice and is almost always required by electrical regulations and building codes, in some cases, the low-voltage wiring may not need to be in a separate compartment. If a low-voltage compartment is not required, a junction box may be made without one. FIG. 20 is a perspective view of the bottom half of a junction box, generally indicated at 700, according to yet another embodiment of the invention. The junction box 700 has a single divider 110 with a U-shaped cut-out 112 that forms one compartment 106 with punch-out frangible portions 108. The divider 110 is not present on the other side of junction box 700. While the junction box 700 of FIG. 20 is not shown with any particular mounting mechanism or hardware, it may include any such mechanism or hardware described above.

In the embodiments described above, when the dividers 24, 26, 110 are present, they are fixedly attached to the junction box 10, 100. Typically, the junction box 10, 100 is made of sheet metal, like sheet steel, and the dividers 24, 26, 110 are up-folded, brazed, welded, riveted, or otherwise permanently secured. However, particularly in cases like that of the junction box 700 described above, where a divider 110 may or may not need to be present, it may be helpful if the dividers 110 are not permanently attached.

Figure 21:
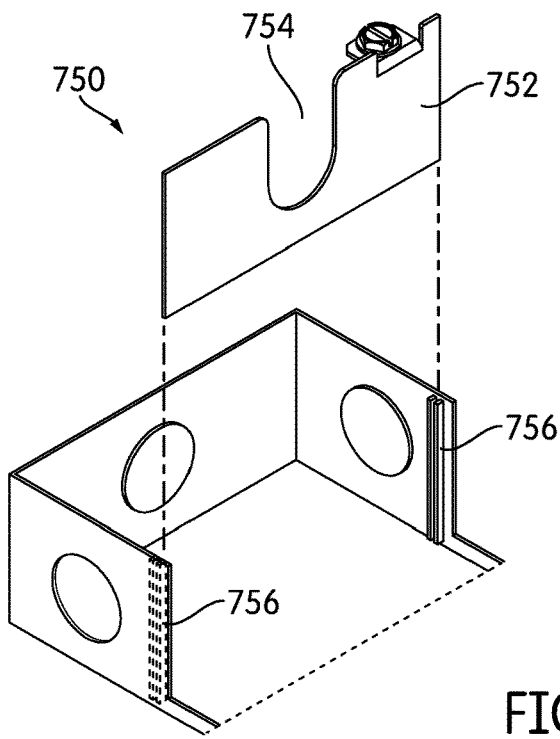

FIG. 21 is an exploded perspective view of a portion of a junction box 750, illustrating a removable divider 752. The removable divider 752 has a U-shaped cut-out 754 and provides the same general functions as do the dividers 24, 26, 110 described above. As shown, the divider 752 slides into a pair of tracks 756 provided on the sides of the junction box 750 at positions where a typical divider would be fixedly connected to the interior of a junction box. The fit between the divider 752 and the tracks 756 may be tight enough so that further fixation is not necessary—for example, the walls of the channels 756 may be spring clips that are biased toward positions in which they grip the divider 752. In some cases, the cover of the junction box (not shown in FIG. 21) may cooperate with the channels 756 to secure the divider 752.

Figure 22:
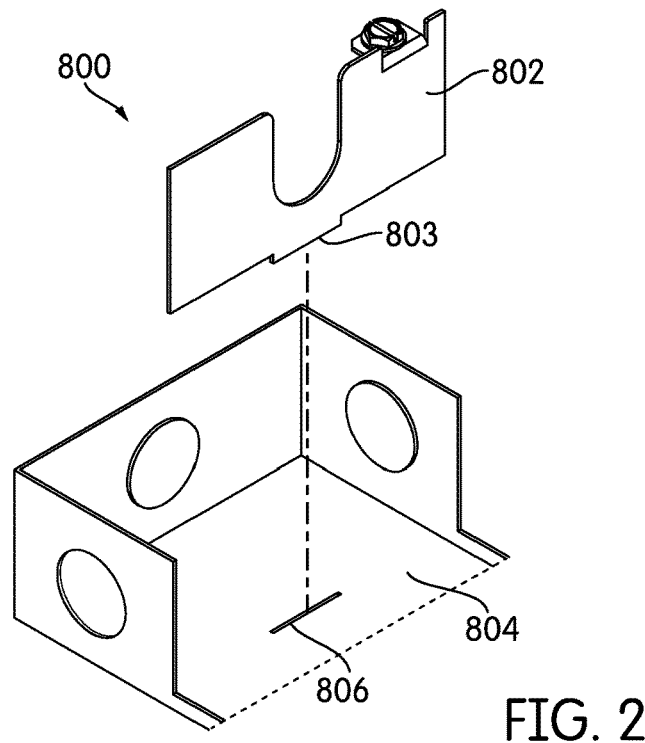

Of course, there are many different ways to secure a removable divider within a junction box, and FIG. 21 illustrates only one such way. FIG. 22 is a similar exploded perspective view of a portion of a junction box 800 according to another embodiment of the invention. In the junction box 800, the divider 802 is also removable. More specifically, the divider 802 has a small depending tab 803 that fits into a corresponding slot 806 in the floor 804 of the junction box 800. This kind of scheme is similar to the mechanism by which dividers are typically mounted in filing cabinets. If additional fixation is necessary, side channels 756 may also be used. In some cases, adhesives, solder, and other such bonding and fixing agents may be used, although in most embodiments, it will be advantageous to avoid such things.

Figure 23:
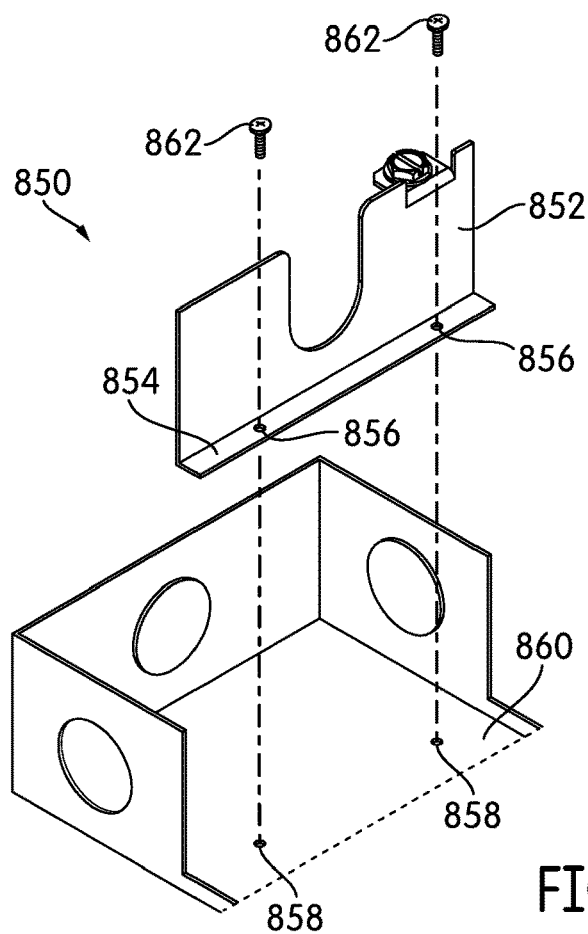

FIG. 23 is a perspective view similar to the view of FIG. 22, illustrating another junction box 850 built to accommodate removable dividers. In this embodiment, the divider 852 has a small horizontal flange 854 with openings 856 for fasteners. A corresponding set of openings 858 is formed in the floor 860 in the junction box 850. The fasteners 862 themselves may be of any type, including machine screws, "Christmas tree" clips, or any other suitable type of fastener.

Aside from their ability to be installed as needed in a junction box, the removable dividers 752, 802, 852 may have all of the features and functions of fixed dividers 24, 26, 110. For example, the dividers 752, 802, 852 may carry flanges 45, 113 for the installation of grounding screws. However, if there is insufficient metal-to-metal contact to provide a good ground, such flanges 45, 113 may be placed elsewhere.

Figure 24:
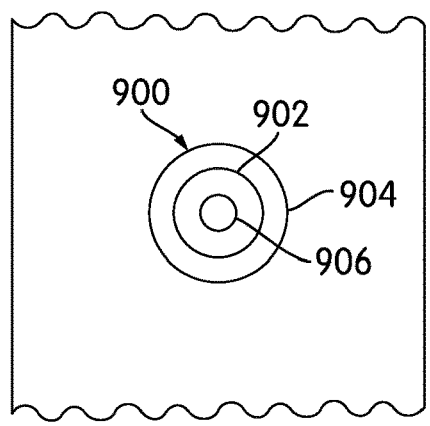
FIG. 24 is an elevational view of a wall of a junction box, illustrating concentric frangible portions for forming an opening in the wall.

In addition to removable dividers, the frangible portions 30, 108 may be modified in some embodiments of the invention. The frangible portions 30, 108 are whole circles of material are provided. When punched out, this results in openings of a single size. This need not always be the case. FIG. 24 is an elevational view of a portion of a sidewall panel with a frangible portion or punch out 900. The punch out 900 has several sets of frangible divisions or break lines 902, 904, 906 which, in the illustration of FIG. 24, are arranged concentrically. These multiple break lines 902, 904, 906 give the installer a choice of how much to break away, and thus, how large the resulting opening will be. In FIG. 24, the frangible break lines 902, 904, 906 are arranged concentrically; in other cases, they may be arranged eccentrically.

As those of skill in the art will note from the above description and the drawings, most of the junction box embodiments described above are intended for interior use. However, embodiments of the invention may be made for interior use, exterior use, or both interior and exterior use.

In many cases, enclosures designed for exterior use need not be completely sealed against the elements, so long as they provide a degree of protection against ingress of solids, like dirt and soil, and a degree of protection against ingress of water, for example, in the form of rain, sleet, or snow. Outdoor enclosures may also need to remain undamaged by formation of ice along their interior. Enclosures that fit these characteristics are often referred to as "weather resistant" or "weatherproof."

Figure 25:
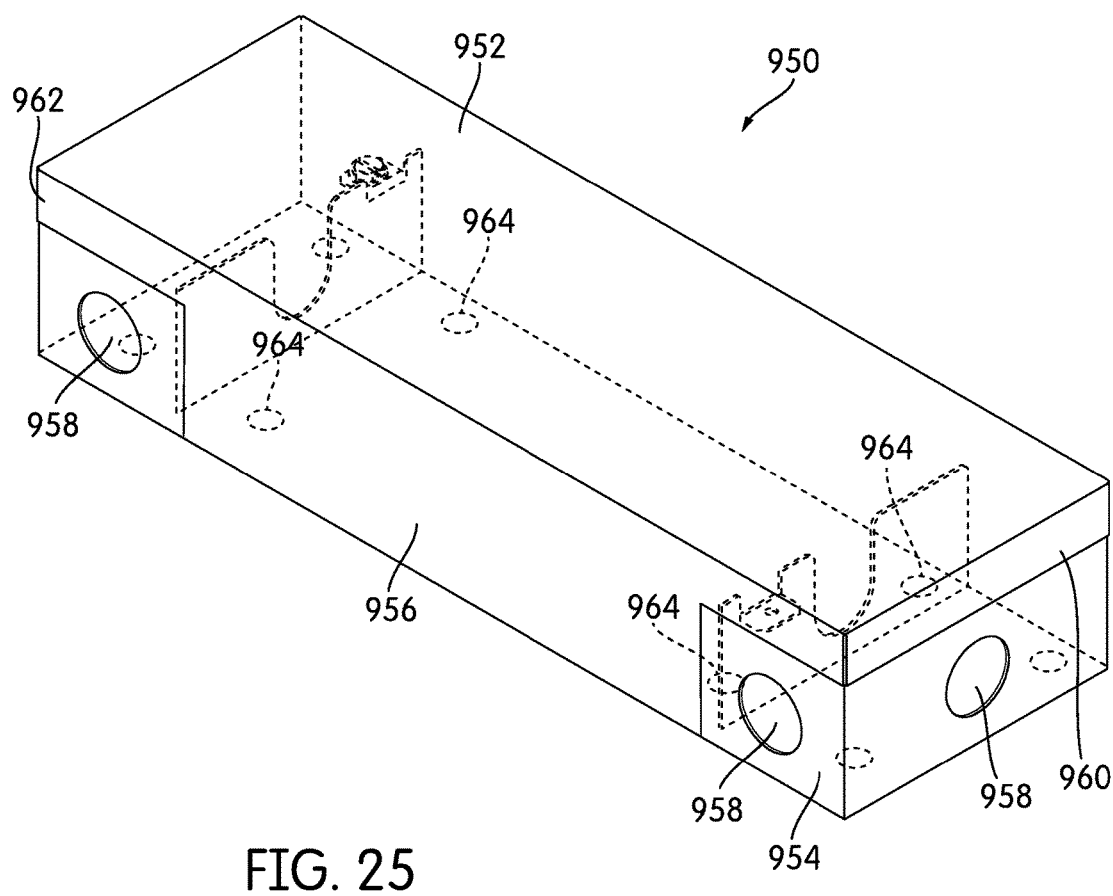
FIG. 25 is a perspective view of a weather-resistant junction box, illustrated with its cover installed.

FIG. 25 is a perspective view of a junction box, generally indicated at 950, that has so-called "weather resistant" features. The junction box 950 has the same basic construction as the other embodiments: a cover 952 fits over a base or bottom 954. As with the other embodiments, the junction box 950 is open along at least one sidewall, with the cover 952 having at least one portion 956 that defines the majority of a sidewall of the junction box 950. Although only one long side of the junction box 950 is shown in the illustration of FIG. 25, the junction box 950 may be open along both long sides, such that the cover 952 has two side panels 956 that define the majority of the long sides of the junction box 950. The junction box 950 also has the kind of symmetry common in other embodiments—both ends are arranged to serve as separate compartments for high voltage or low voltage, and both ends also have at least one frangible portion 958 that can be punched out to allow for passage of wires or attach to conduit or to other fittings.

For simplicity and ease in illustration, FIG. 25 does not show the junction box 950 with any particular mounting hardware. However, as with the other junction boxes described here, the junction box 950 may include any of the types of mounting hardware described above, and especially mounting hardware that minimizes or eliminates the need for tools. The junction box 950 may also be of any size, and like the junction box 200 described above, may hold and secure multiple drivers.

Relative to other embodiments, though, the cover 952 includes additional features. Specifically, on each side, the cover 952 has depending, folded-down flaps 960, 962 that cover the joint between cover 952 and base 954, much like the eaves of a roof on a house. These folded-down flaps 960, 962 make it more difficult for water, dirt, or debris to enter at the joints. As can also be appreciated from the drawings, the cover 952 does not include a regular pattern of holes or other openings for ventilation.

The guiding principle for many "weather resistant" or "weatherproof" enclosures is that while the design should ensure that water cannot enter the enclosure easily, it should also be relatively easy for any water that does get into the enclosure to drain out. For that reason, the enclosure includes a pattern of drainage holes 964 along its bottom. Drainage holes 964 may be placed in any useful location, and their precise location may depend on a number of factors, including how the junction box 950 is to be attached to external structures and its intended orientation relative to gravity—drainage holes 964 are best placed in locations that allow water to exit naturally.

Figure 26:
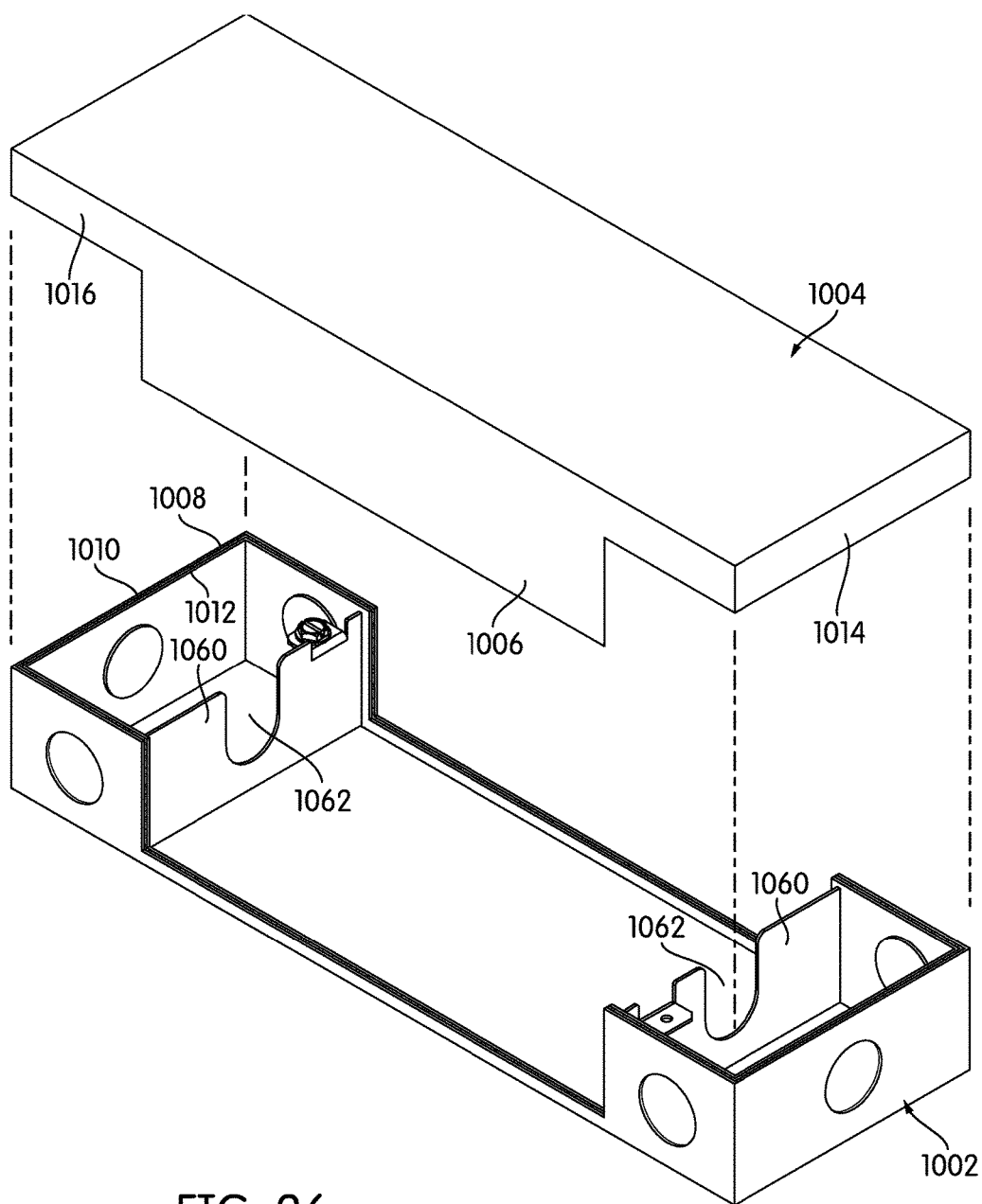
FIG. 26 is an exploded perspective view of a weather-resistant junction box according to another embodiment of the invention.

Of course, while the junction box 950 may suffice as a "weather resistant" enclosure, other environments may require more complete sealing against ingress by water and other elements. FIG. 26 is an exploded perspective view of an embodiment of a junction box, generally indicated at 1000, that has more ability to seal against the elements. More specifically, the junction box 1000 has the familiar configuration of a base or bottom 1002 and a cover 1004. The two long sides of the bottom 1002 are open, and the cover 1004 includes side panels 1006 that cover and close the sides. The junction box 1000 also has a symmetrical shape and layout, with compartments at both ends to serve as high-voltage and low-voltage compartments.

In order to provide a better seal, the bottom 1002 of the junction box 1000 has an upper rim 1008 with a channel 1010. Carried in the channel 1010 is a rubber or plastic gasket 1012. When installed, the cover 1004 bears on the gasket 1012 and thus provides a seal. The cover 1004 also has folded-down flaps 1014, 1016 that cover much of the joint with the gasket 1012. Like the other weather-resistant junction box 950, the junction box 1000 does not include ventilation holes or, in this case, any other openings.

The gasket 1012 of the illustrated embodiment is a single gasket that has been molded to the shape of the edge of the bottom 1002. However, the same function may be performed by several gaskets that are placed in the channel 1010. In some embodiments, the structure in question need not be a gasket per se—for example, rubber or foam strips could perform the function in at least some embodiments.

Figure 27:
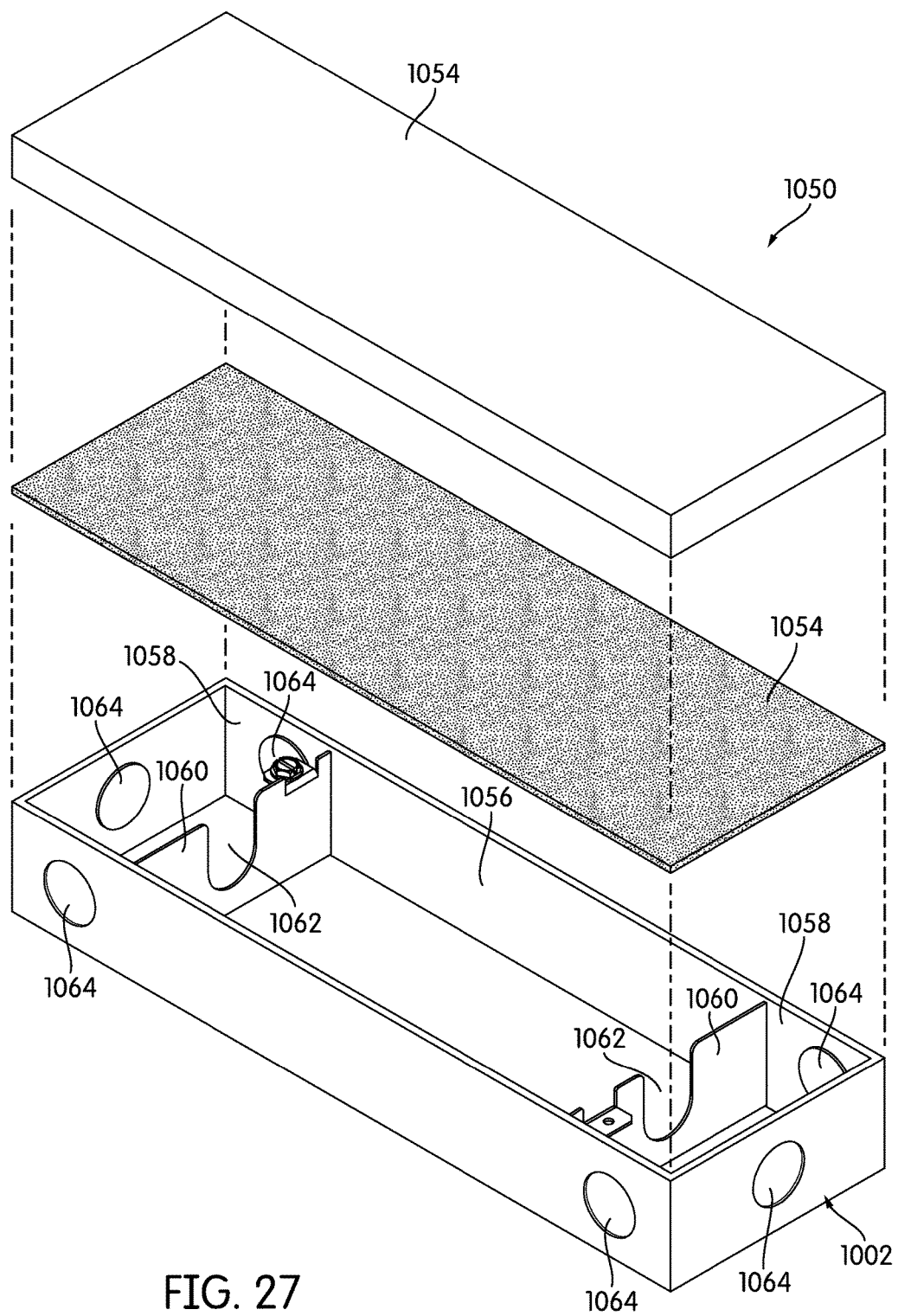
FIG. 27 is an exploded perspective view of a weather-resistant junction box according to yet another embodiment of the invention.

Of course, sealing a complex, three-dimensional edge is typically more difficult than sealing an edge that exists along a single plane. If a three-dimensional edge sealing interface is undesirable, junction boxes according to embodiments of the invention may be made without it. FIG. 27 is an exploded perspective view of a junction box, generally indicated at 1050, that has a simpler edge or interface to seal. The junction box 1050, unlike other embodiments, comprises a five-sided bottom 1052 and a cover 1054 that acts as a lid. A layer of foam or rubber 1054 fits tightly within the lid 1054 and makes a seal against the bottom 1052 when the lid 1054 is on the junction box 1050.

Thus, the junction box 1050 is constructed to be more fully sealed against its environment, as may be useful for more-than-incidental contact with water or detritus. In this particular embodiment, the junction box 1050 sacrifices some of the openness that characterizes the other embodiments, as both long sidewalls are closed, but retains many of the features of the other embodiments.

More specifically, the junction box 1050 has a central compartment 1056 adapted to secure a driver and two identical end compartments 1058 that serve as connecting areas for high- and low-voltage wires. The dividers 1060 between these compartments 1056, 1058 have U-shaped cut outs 1062 that allow a driver to be dropped in without needing to pull wires through the dividers 1060. The junction box 1050 also has the symmetry of other embodiments, meaning that, once again, it does not matter which compartment 1058 serves as the high-voltage compartment and which one serves as the low-voltage compartment. Frangible portions 1064 are provided in the sidewalls of each of the end compartments 1058 that, as with the other embodiments, can be broken out to create openings for wires to pass. Within the main compartment 1056, the driver may be secured in any of the ways described above. Moreover, although the junction box 1050 is illustrated as accommodating a single driver, the junction box 1050 may be widened to accommodate any number of drivers.

Although the above description focuses on placing a driver within a junction box, junction boxes according to embodiments of the invention may house other components, either alone or in addition to a driver. For example, in some embodiments, a low-voltage LED controller may be co-located with a driver in a junction box. This kind of arrangement may be implemented in much the same way that multiple drivers are installed in a junction box, as shown in, e.g., FIGS. 8-12. Alternatively, such an arrangement could make use of a larger central/low-voltage compartment, as in FIG. 20, with a fastening mechanism (or points for hardware attachment) provided for both the driver and the controller.

While the invention has been described with respect to certain embodiments, the embodiments are intended to be exemplary, rather than limiting. Modifications and changes may be made within the scope of the invention.

What is claimed is:
1. A junction box, comprising:
   a horizontal base having
      an open central portion open at two opposed sides, and
      two opposite end portions, each end portion having a four-walled compartment arising from the horizontal base, the four-walled compartments being at least substantially identical and spaced from one another by the open central portion, each of the four-walled compartments including
         three vertical outer sidewalls, each of the three vertical outer sidewalls being aligned with an edge of the horizontal base and defining a portion of a sidewall of the junction box, and each of the three vertical outer sidewalls having at least one frangible portion that is adapted to be broken away to form an opening, and
         a vertical inner sidewall separating the four-walled compartment from the open central portion of the base;
   at least two mounting positions, each of the at least two mounting positions including or being associated with mounting structure secured, or adapted to be secured, to the open central portion of the base to secure a driver;
   at least two cut-outs in each of the vertical inner sidewalls, the at least two cut-outs corresponding in number and position to the at least two mounting positions, and the at least two cut-outs in the respective vertical inner sidewalls being aligned with one another across a length of the open central portion of the base, each of the at least two cut-outs beginning at a top edge of one of the vertical inner sidewalls and extending downwardly; and
   a U-shaped cover having
      an upper face with a size and shape matching a size and shape of a lower face of the horizontal base, and
      two depending side portions, the two depending side portions being sized and adapted to create a contiguous sidewall between the two four-walled compart- ments, such that when installed, the cover forms a closed enclosure with the base.

2. The junction box of claim 1, wherein the junction box is a rectangular prism with the cover installed on the horizontal base.

3. The junction box of claim 1, wherein the cut-outs on the inner sidewalls of the four-walled compartments are U-shaped.

4. The junction box of claim 1, wherein each of the four-walled compartments includes a grounding screw adapted to secure a ground wire.

5. The junction box of claim 4, wherein each of the vertical inner sidewalls includes a horizontal flange with a threaded opening for the grounding screw.

6. The junction box of claim 1, wherein the cover is perforated.

7. The junction box of claim 1, wherein the horizontal base and the U-shaped cover are made of sheet metal.

8. The junction box of claim 1, wherein the frangible portions are round.

9. The junction box of claim 1, wherein each of the mounting structures comprises one or more Z-brackets; clips; fixed straps that engage with a buckle; fixed straps that engage with a quick-release; a hinged bracket; depending wedges on an underside of the upper face of the cover; or depending spring clips on the underside of the upper face of the cover.

10. The junction box of claim 1, wherein each of the mounting structures is staggered in position with respect to the others.

11. The junction box of claim 1, wherein the mounting structure comprises a single, common mounting structure that is adapted to secure the driver at each of the two or more mounting positions.

12. The junction box of claim 11, wherein the single, common mounting structure comprises a bracket.

13. The junction box of claim 12, wherein the single, common bracket includes at least one downwardly-extending portion to define a lateral spacing between respective mounting positions.

14. The junction box of claim 12, wherein the downwardly-extending portions extend to the horizontal base and are adapted to be secured to the horizontal base.

15. A junction box, comprising:
a horizontal base having
an open central portion open at two opposed sides, and
two opposite end portions, each end portion having a four-walled compartment arising from the horizontal base, the four-walled compartments being at least substantially identical and spaced from one another by the open central portion, each of the four-walled compartments including
three vertical outer sidewalls, each of the three vertical outer sidewalls being aligned with an edge of the horizontal base and defining a portion of a sidewall of the junction box, and each of the three vertical outer sidewalls having at least one frangible portion that is adapted to be broken away to form an opening, and
a vertical inner sidewall separating the four-walled compartment from the open central portion of the base;
at least two mounting positions;
at least two cut-outs in each of the vertical inner sidewalls, the at least two cut-outs corresponding in number and position to the at least two mounting positions, and the at least two cut-outs in the respective vertical inner sidewalls being aligned with one another across a length of the open central portion of the base, each of the at least two cut-outs beginning at a top edge of one of the vertical inner sidewalls and extending downwardly; and
a U-shaped cover having
an upper face with a size and shape matching a size and shape of a lower face of the horizontal base,
two depending side portions, the two depending side portions being sized and adapted to create a contiguous sidewall between the two four-walled compartments, such that when installed, the cover forms a closed enclosure with the base, and
at least two mounting structures depending from an underside of the upper face of the U-shaped cover, the at least two mounting structures corresponding in position to the at least two mounting positions of the horizontal base.

16. The junction box of claim 15, wherein the at least two mounting structures comprise sets of wedges.

17. The junction box of claim 15, wherein the at least two mounting structures comprise sets of clips.

18. The junction box of claim 15, wherein the junction box is a rectangular prism with the cover installed on the horizontal base.

19. The junction box of claim 15, wherein the cut-outs on the inner sidewalls of the four-walled compartments are U-shaped.

20. The junction box of claim 15, wherein each of the four-walled compartments includes a grounding screw adapted to secure a ground wire.

\* \* \* \* \*